(12) United States Patent
Kim et al.

(10) Patent No.: US 12,395,048 B2
(45) Date of Patent: *Aug. 19, 2025

(54) CONTROLLER AND MOTOR ASSEMBLY COMPRISING SAME

(71) Applicant: LG INNOTEK CO., LTD., Seoul (KR)

(72) Inventors: Chan Seok Kim, Seoul (KR); Kun Yong Song, Seoul (KR); Duck Hyun Song, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 248 days.

This patent is subject to a terminal disclaimer.

(21) Appl. No.: 18/074,626

(22) Filed: Dec. 5, 2022

(65) Prior Publication Data
US 2023/0098103 A1    Mar. 30, 2023

Related U.S. Application Data

(63) Continuation of application No. 16/647,813, filed as application No. PCT/KR2018/008514 on Jul. 27, 2018, now Pat. No. 11,545,878.

(30) Foreign Application Priority Data

Sep. 29, 2017 (KR) .......................... 10-2017-0128155
Oct. 16, 2017 (KR) .......................... 10-2017-0133853
Nov. 13, 2017 (KR) .......................... 10-2017-0150611

(51) Int. Cl.
*H02K 11/33* (2016.01)
*H02K 5/06* (2006.01)
(Continued)

(52) U.S. Cl.
CPC .............. *H02K 11/33* (2016.01); *H02K 5/06* (2013.01); *H02K 5/225* (2013.01); *H05K 7/20854* (2013.01); *H05K 2201/0999* (2013.01)

(58) Field of Classification Search
CPC .. H02K 5/00; H02K 5/06; H02K 5/22; H02K 5/225; H02K 11/00; H02K 11/02;
(Continued)

(56) References Cited

U.S. PATENT DOCUMENTS 8,304,942 B2    11/2012 Yamasaki et al.
11,545,878 B2 *  1/2023 Kim .......................... H02K 5/06
(Continued)

FOREIGN PATENT DOCUMENTS

CN    106849449 A       6/2017
EP          2050654 A1 *  4/2009 ............. H02K 11/33
(Continued)

*Primary Examiner* — Tran N Nguyen
(74) *Attorney, Agent, or Firm* — Birch, Stewart, Kolasch & Birch, LLP

(57) ABSTRACT

A controller including a first housing; a first cover disposed on an opening of the first housing; filter units disposed above the first cover; a power module unit disposed below the first cover; and a substrate disposed below the power module unit; wherein the power module unit includes a bracket; and a power module disposed between the bracket and the first cover, and wherein the power module includes a power module body; a plurality of first pins arranged to protrude downward from one side of the power module body; and five terminal pins arranged to protrude downward from the other side of the power module body, wherein an end portion of the first pin is coupled to the substrate.

20 Claims, 38 Drawing Sheets

(51) Int. Cl.
*H02K 5/22* (2006.01)
*H05K 7/20* (2006.01)

(58) Field of Classification Search
CPC . H02K 11/33; H02K 7/00; H02K 7/20; H02K 7/208; H02K 7/20854
See application file for complete search history.

(56) References Cited

U.S. PATENT DOCUMENTS

| | | |
|---|---|---|
| 2012/0098391 A1 | 4/2012 | Yamasaki et al. |
| 2013/0088128 A1 | 4/2013 | Nakano et al. |
| 2013/0257192 A1 | 10/2013 | Tsuboi et al. |
| 2015/0323756 A1 | 11/2015 | Cho et al. |
| 2016/0347353 A1 | 12/2016 | Wada et al. |
| 2017/0008554 A1 | 1/2017 | Hirotani et al. |

FOREIGN PATENT DOCUMENTS

| | | |
|---|---|---|
| EP | 2 398 136 A1 | 12/2011 |
| KR | 10-2016-0081675 A | 7/2016 |

* cited by examiner

【FIG. 1】
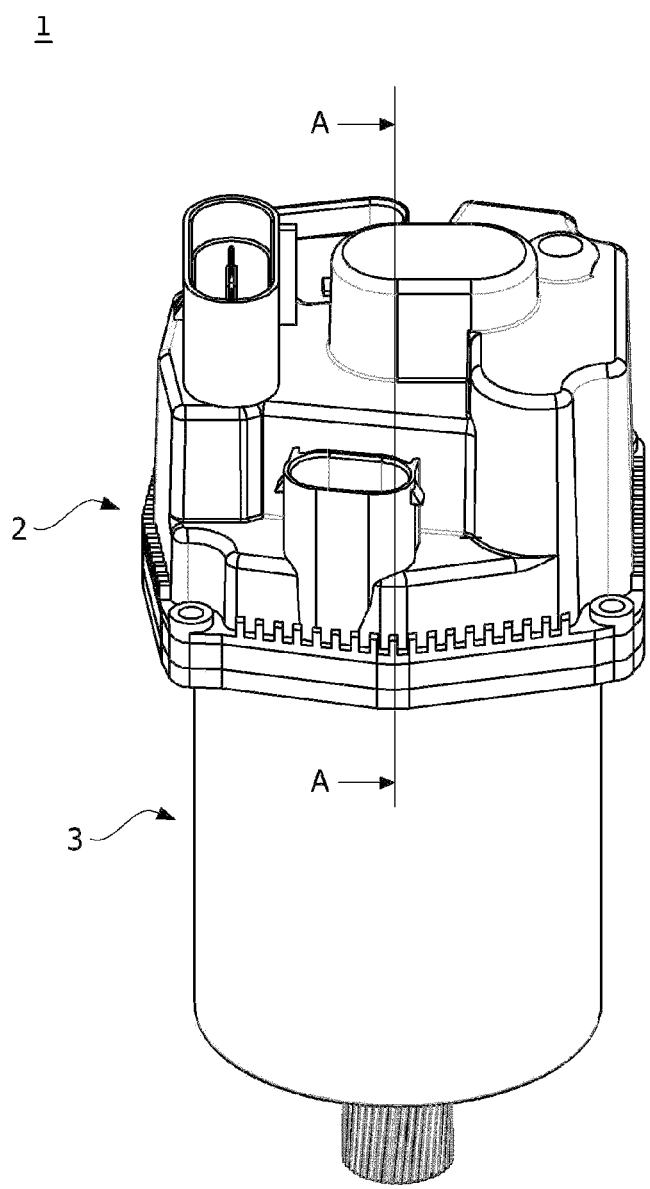

【FIG. 2】
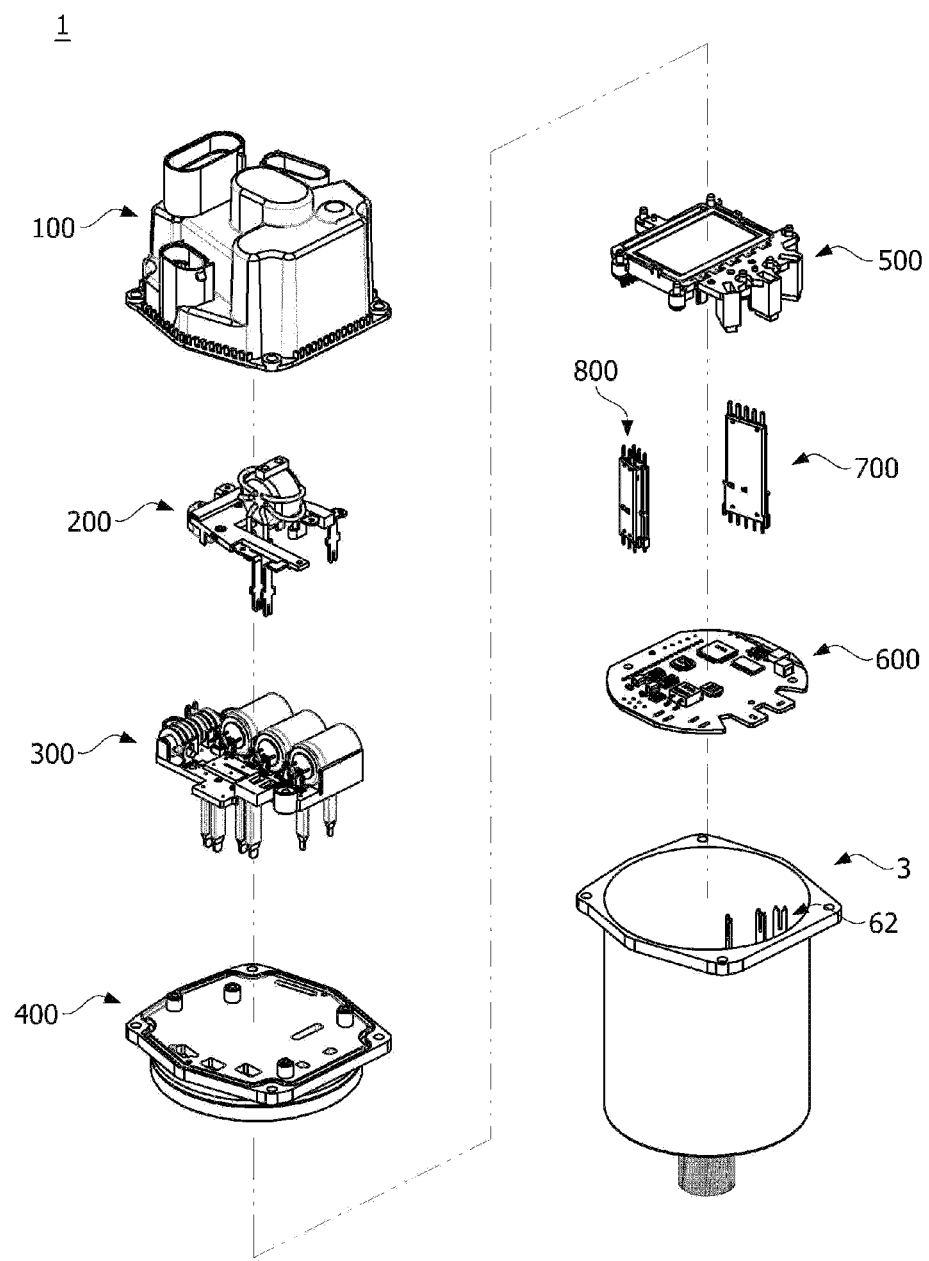

[FIG. 3]
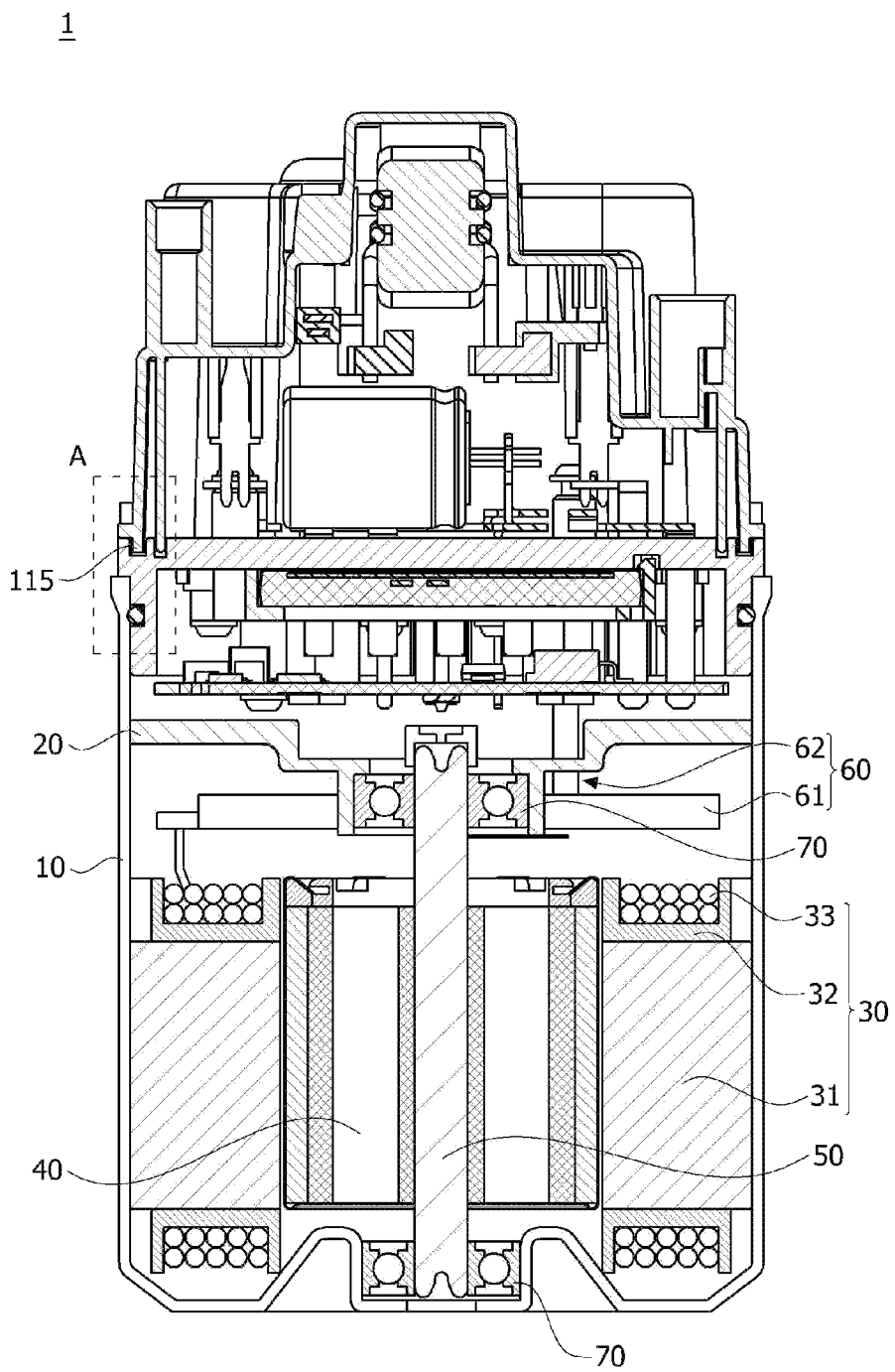

[FIG. 4]
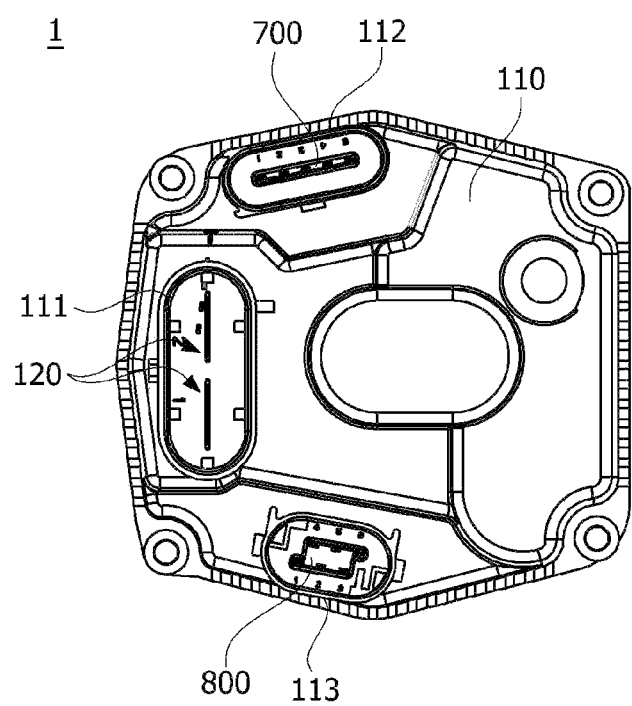

【FIG. 5】
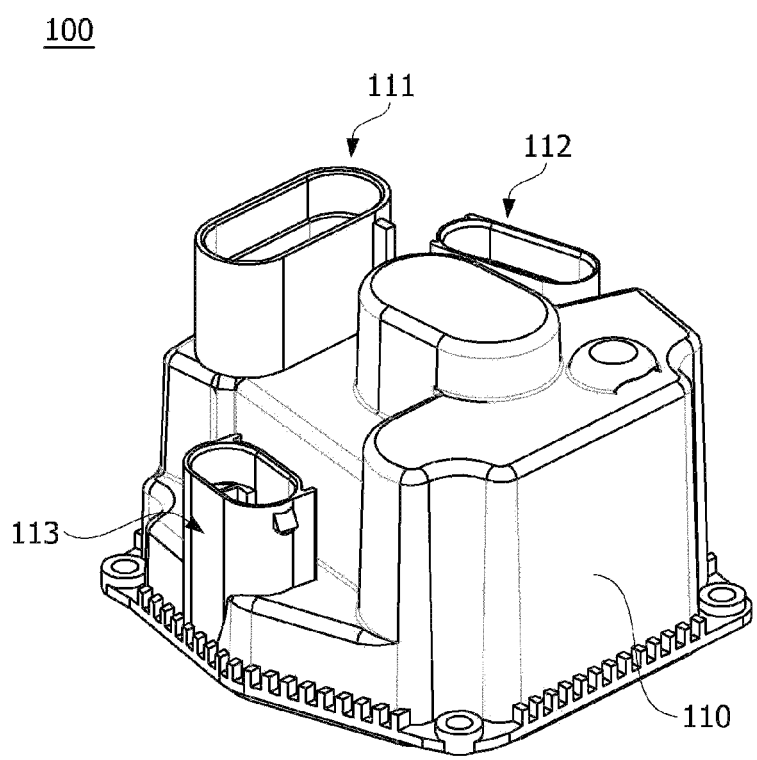

[FIG. 6]
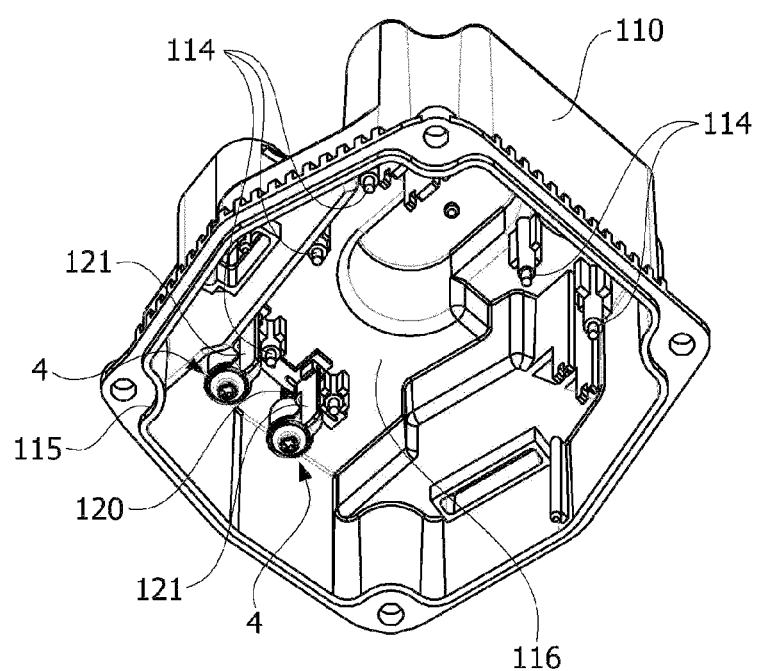

[FIG. 7]
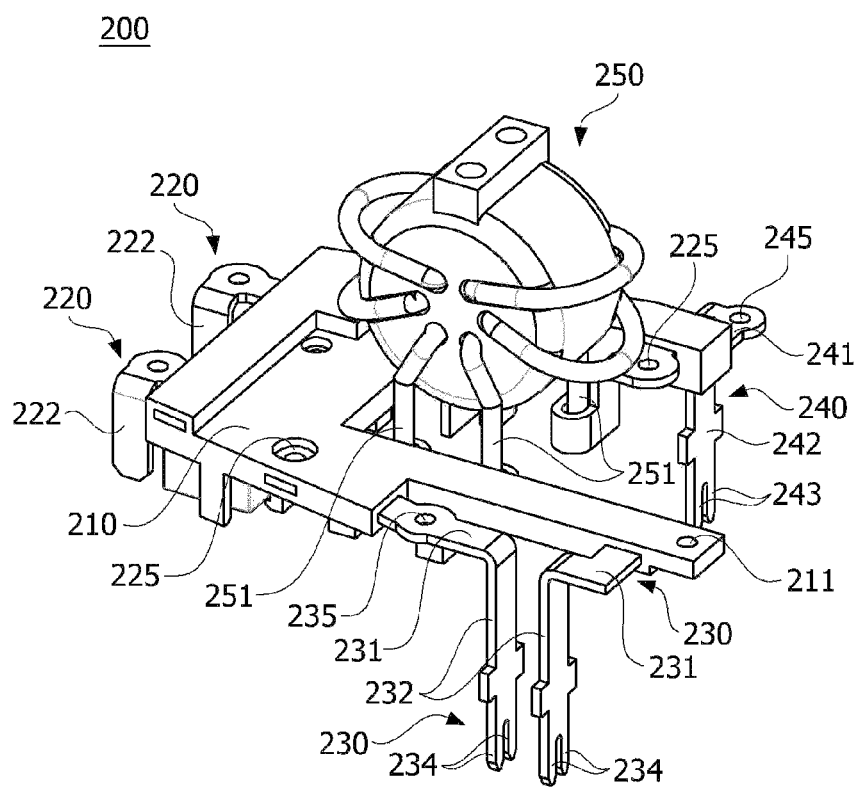

[FIG. 8]
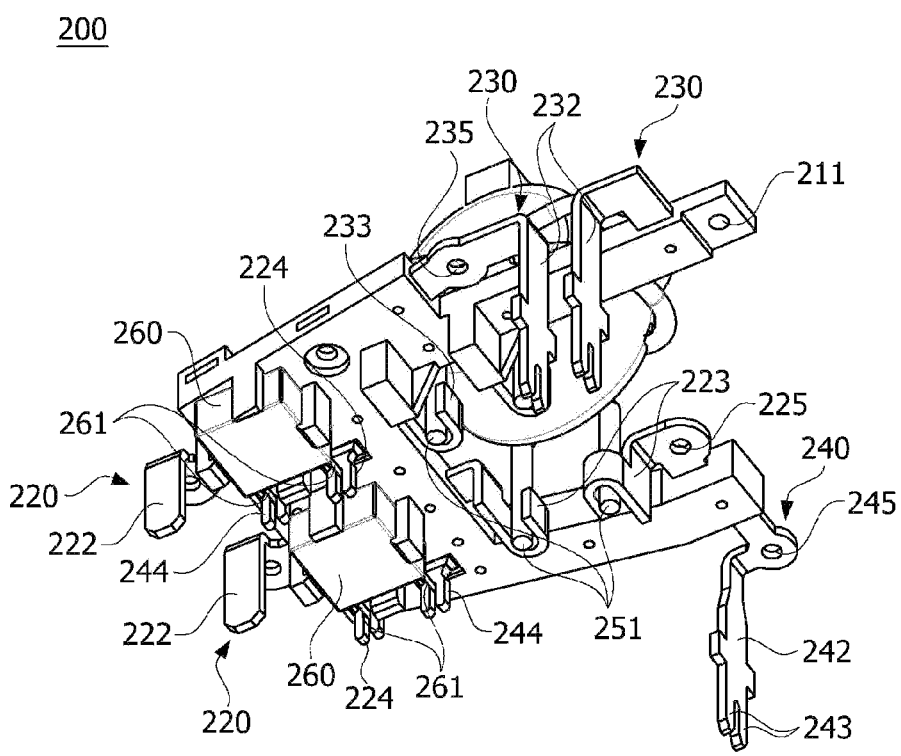

[FIG. 9]
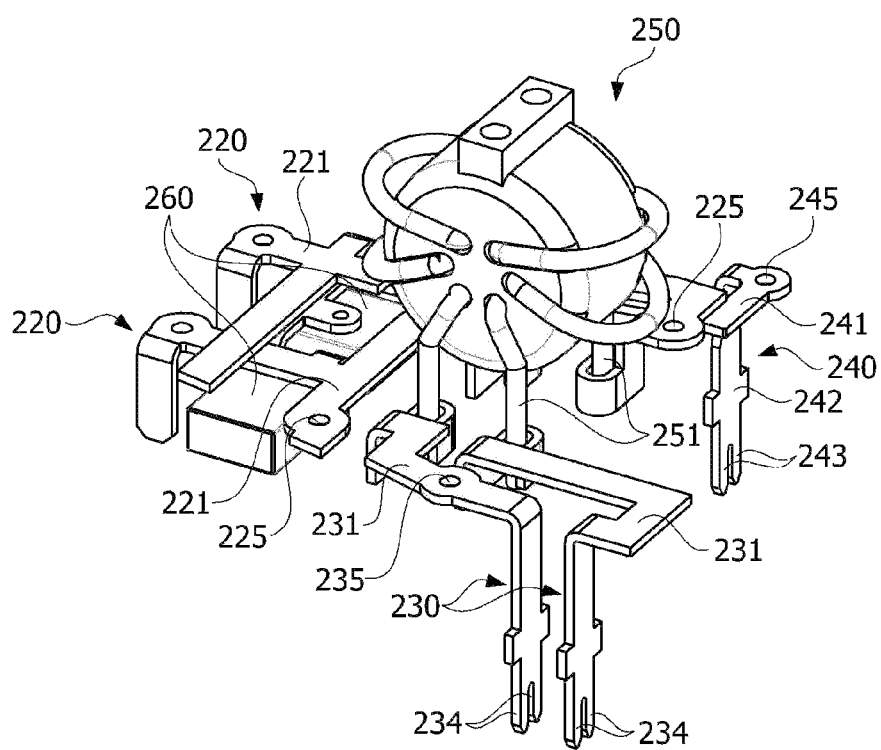

[FIG. 10]
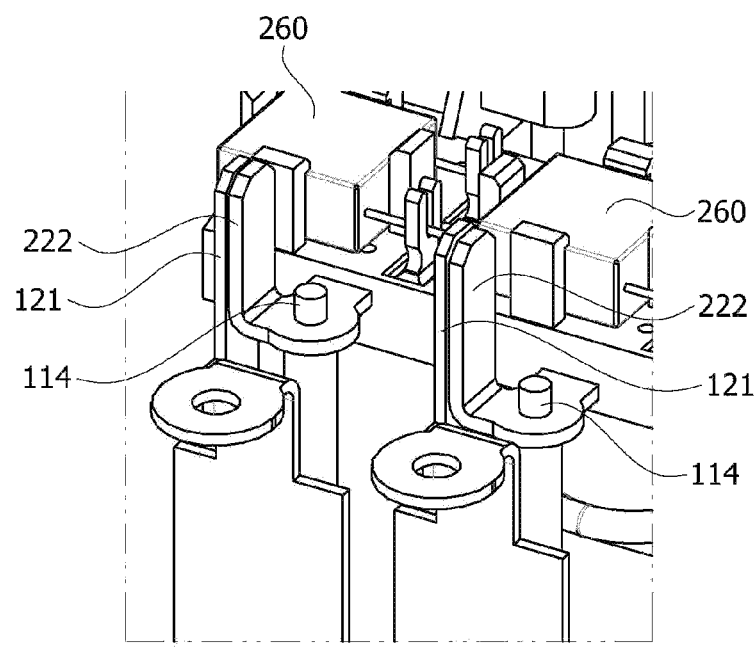
[FIG. 11]
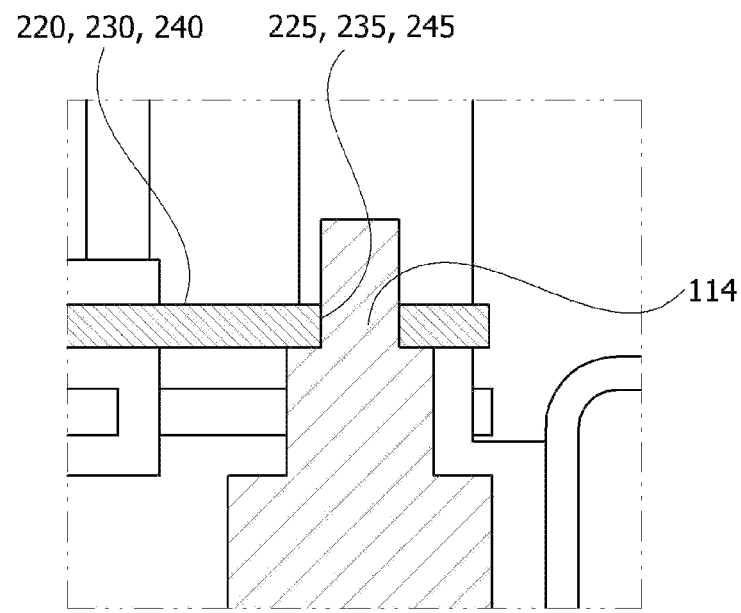

【FIG. 12】
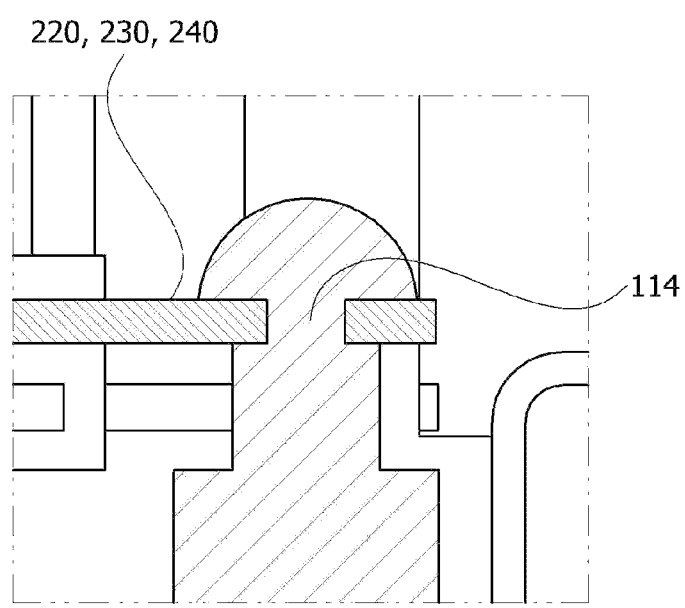

[FIG. 13]
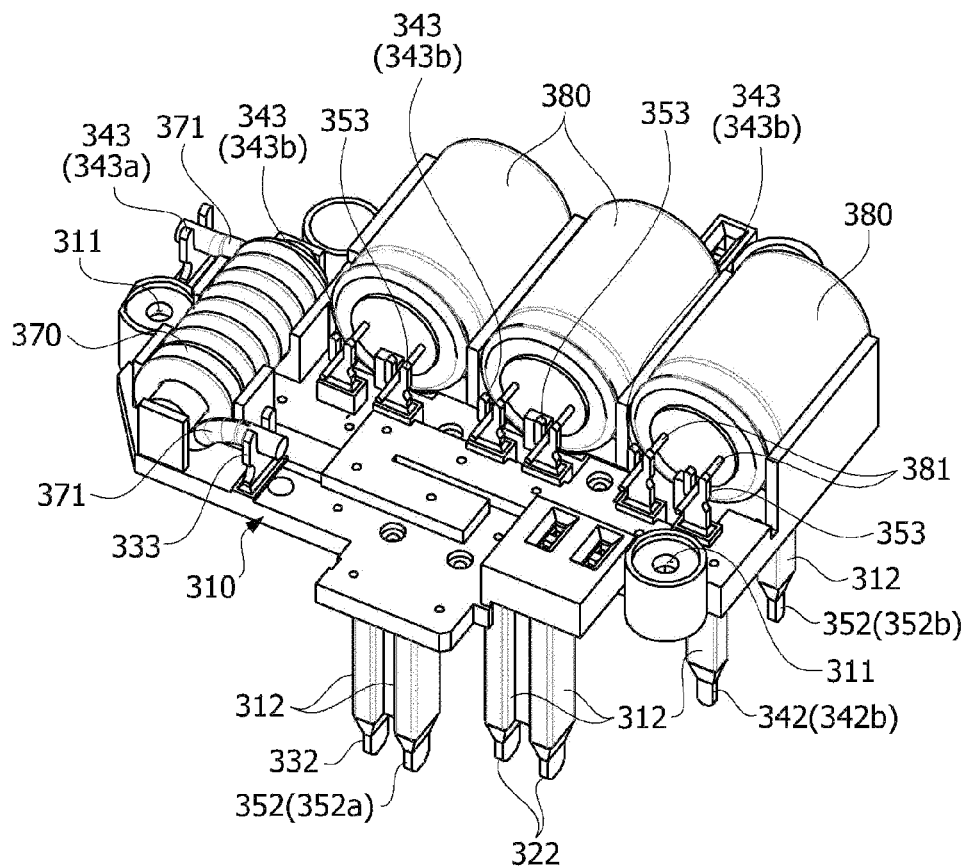

[FIG. 14]
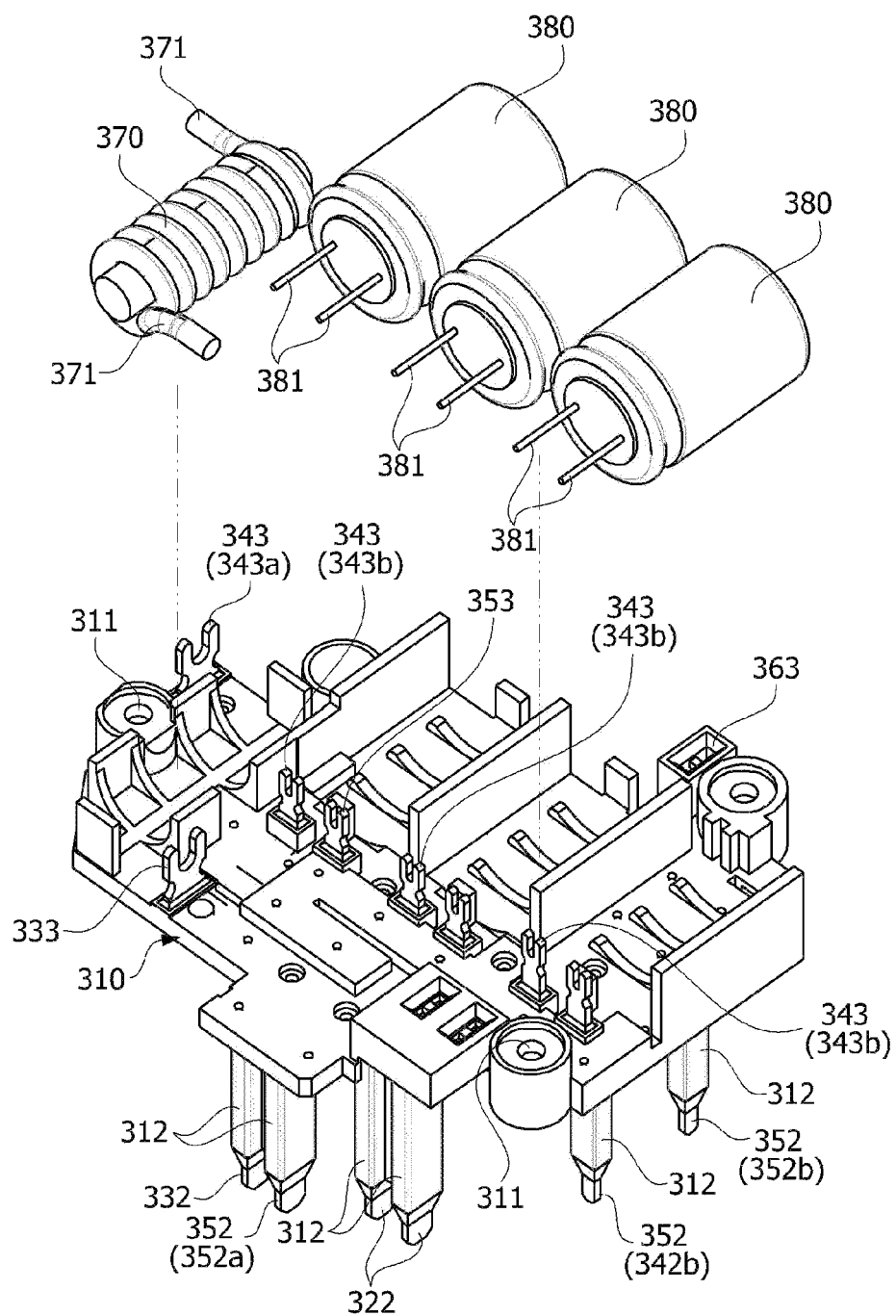

[FIG. 15]
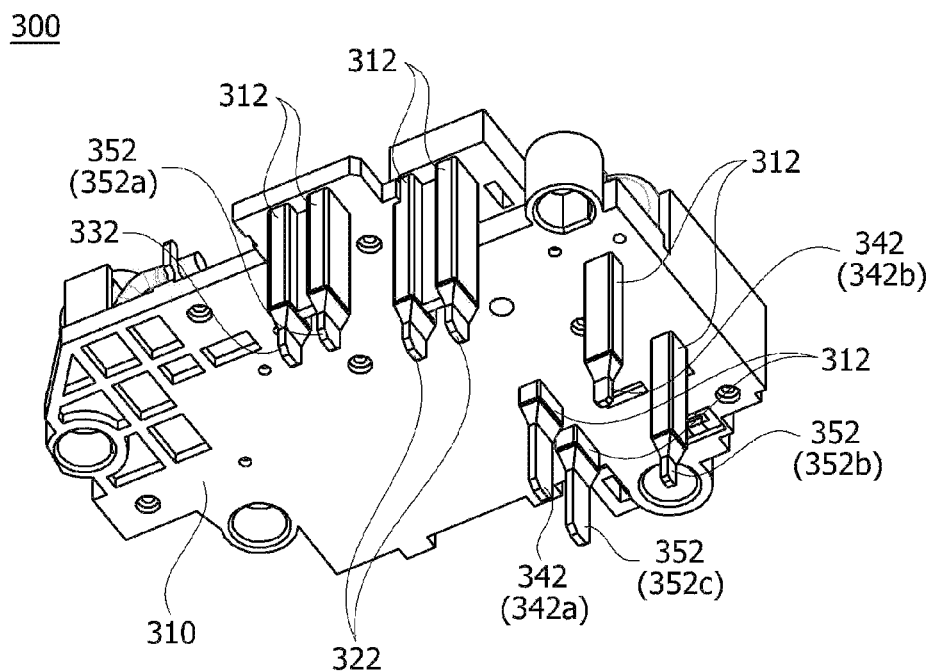

【FIG. 16】
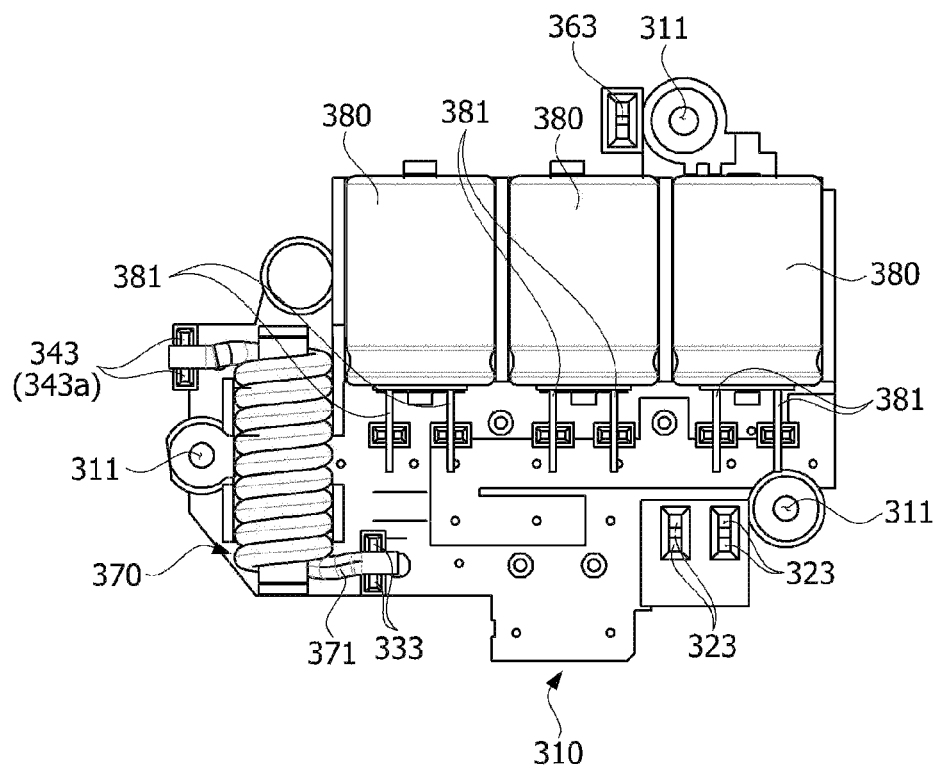

[FIG. 17]
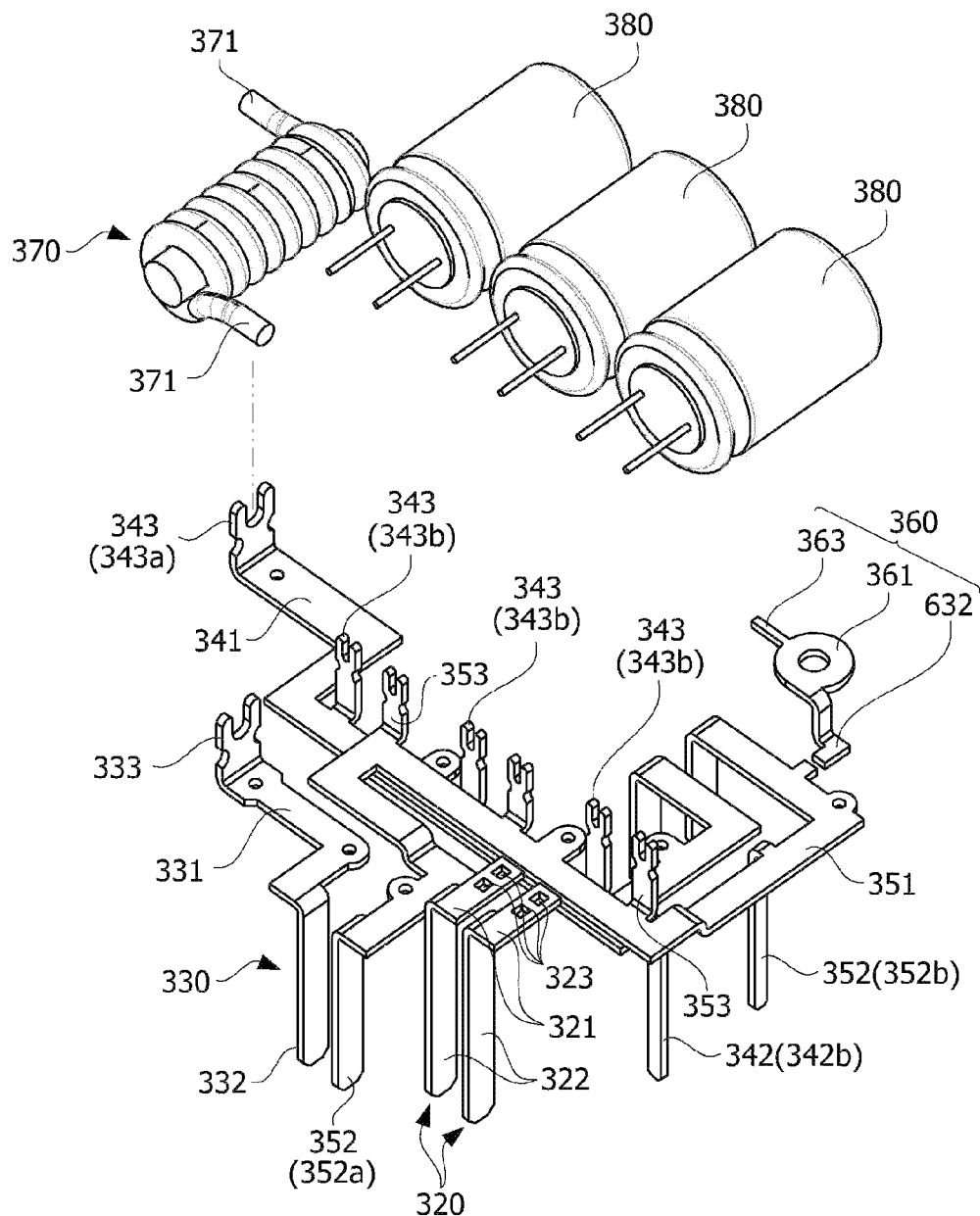

[FIG. 18]
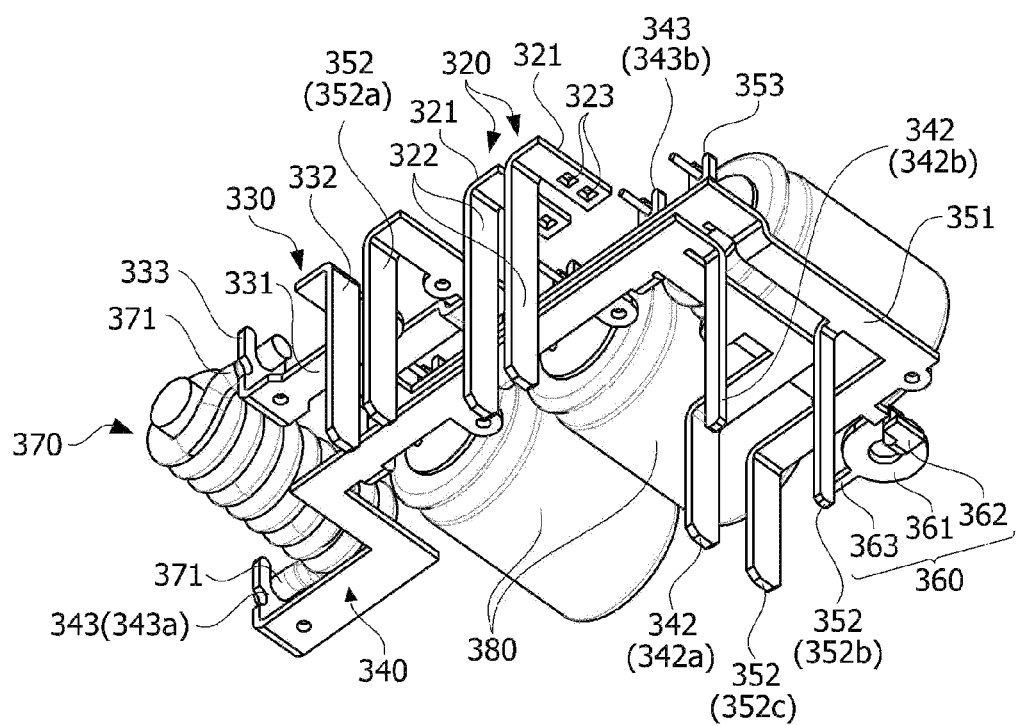

[FIG. 19]
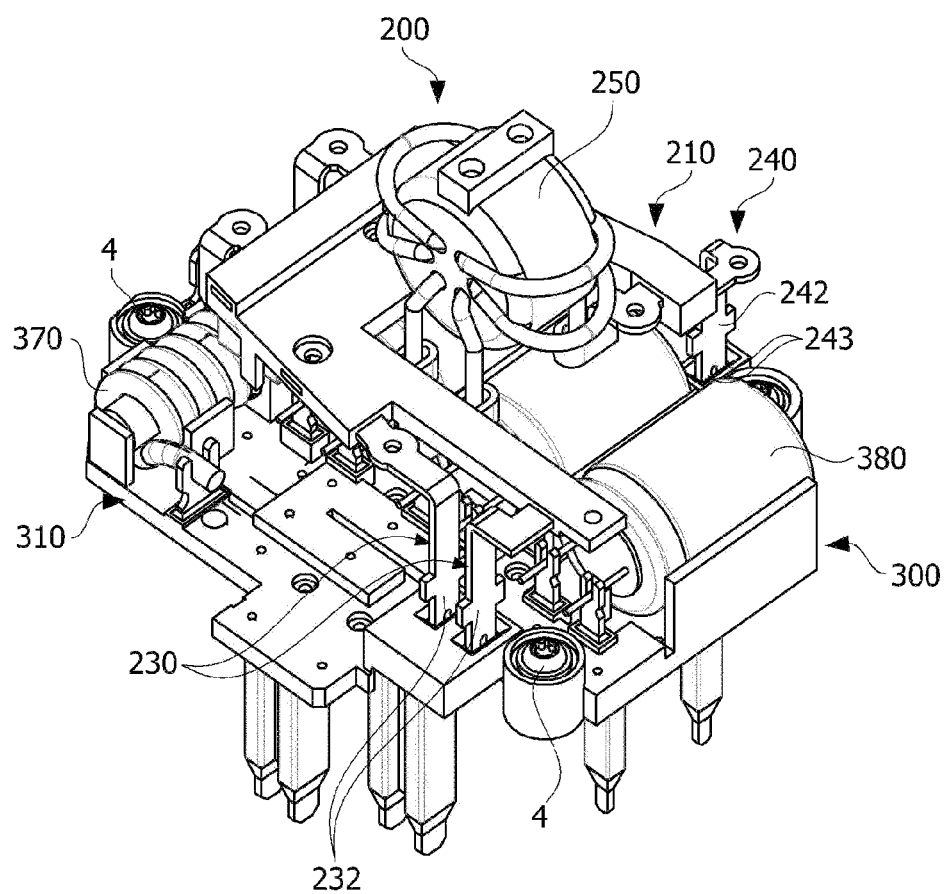

[FIG. 20]
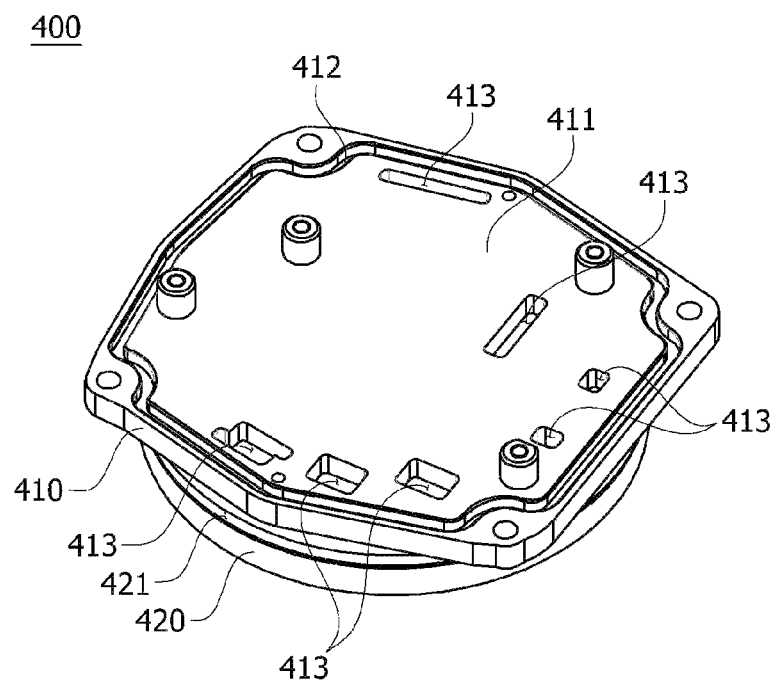

[FIG. 21]
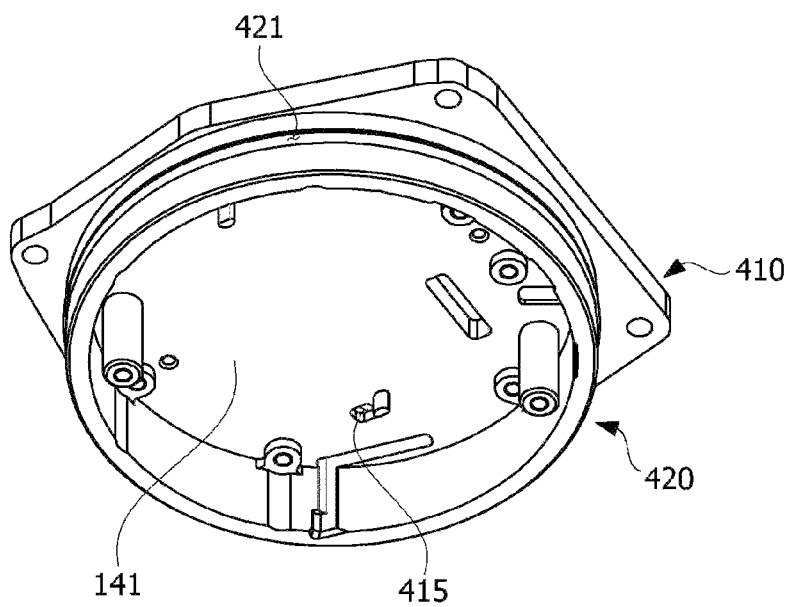

[FIG. 22]
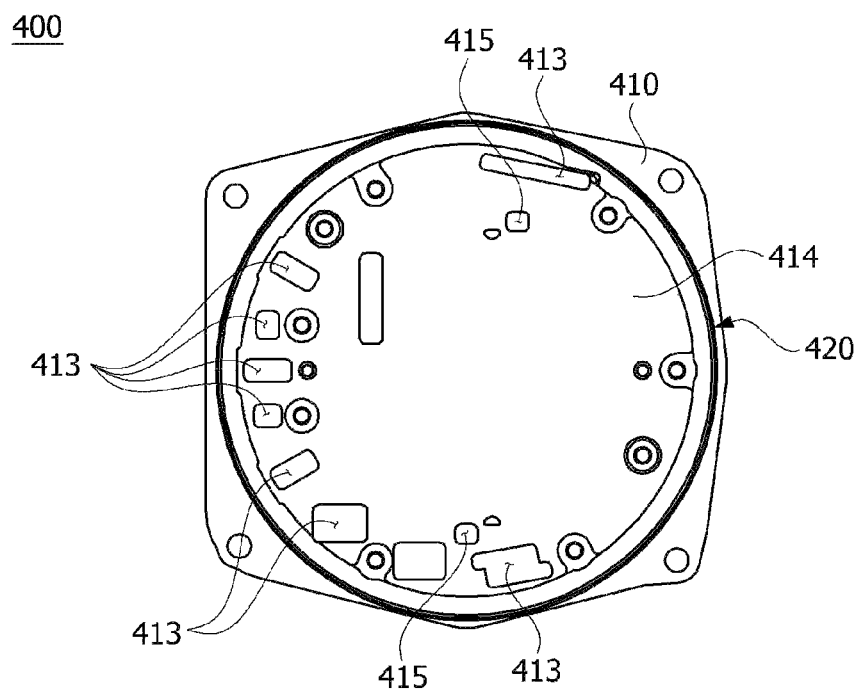

[FIG. 23]
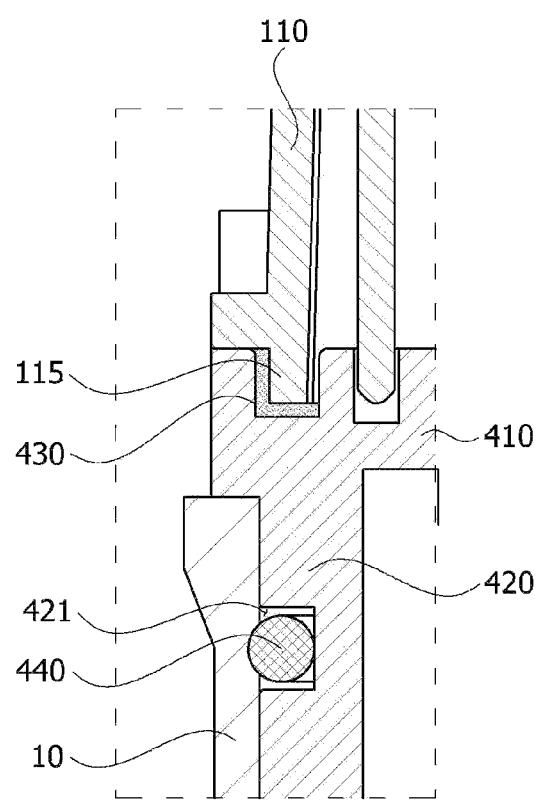

【FIG. 24】
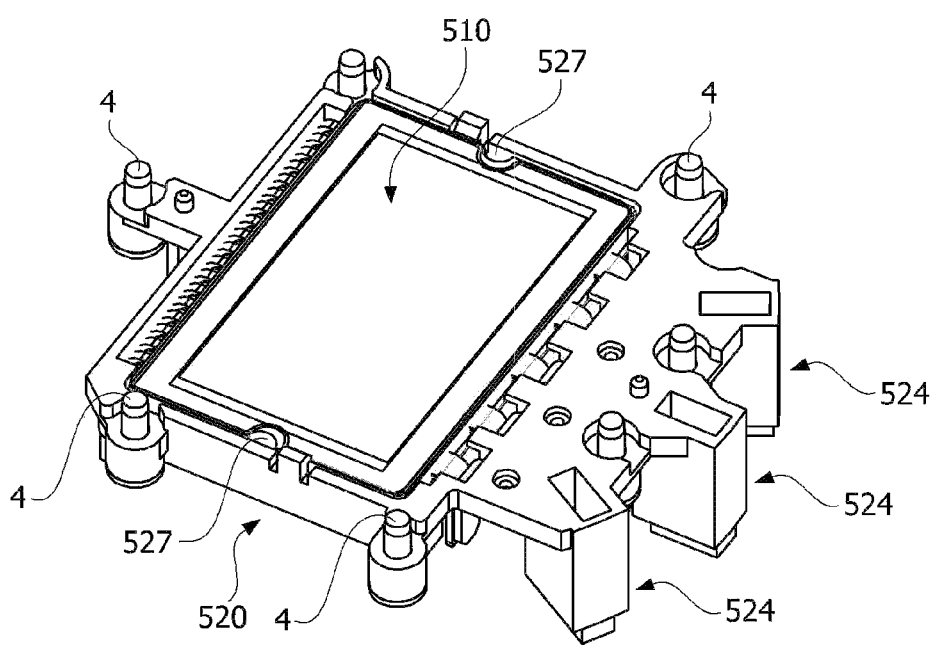

[FIG. 25]
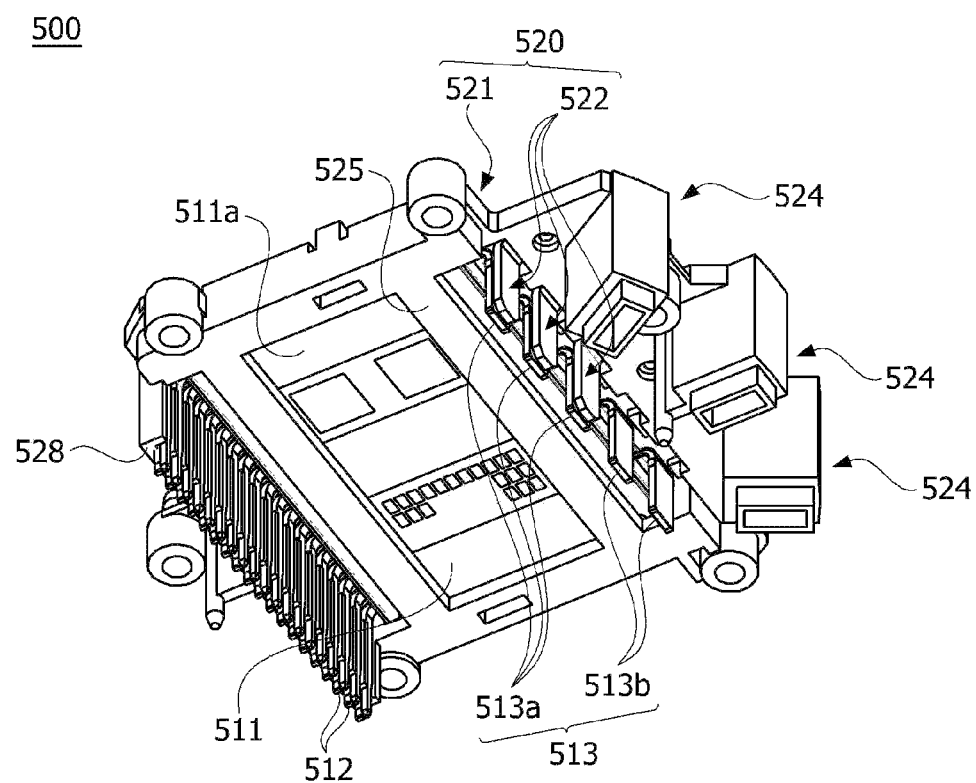

[FIG. 26]
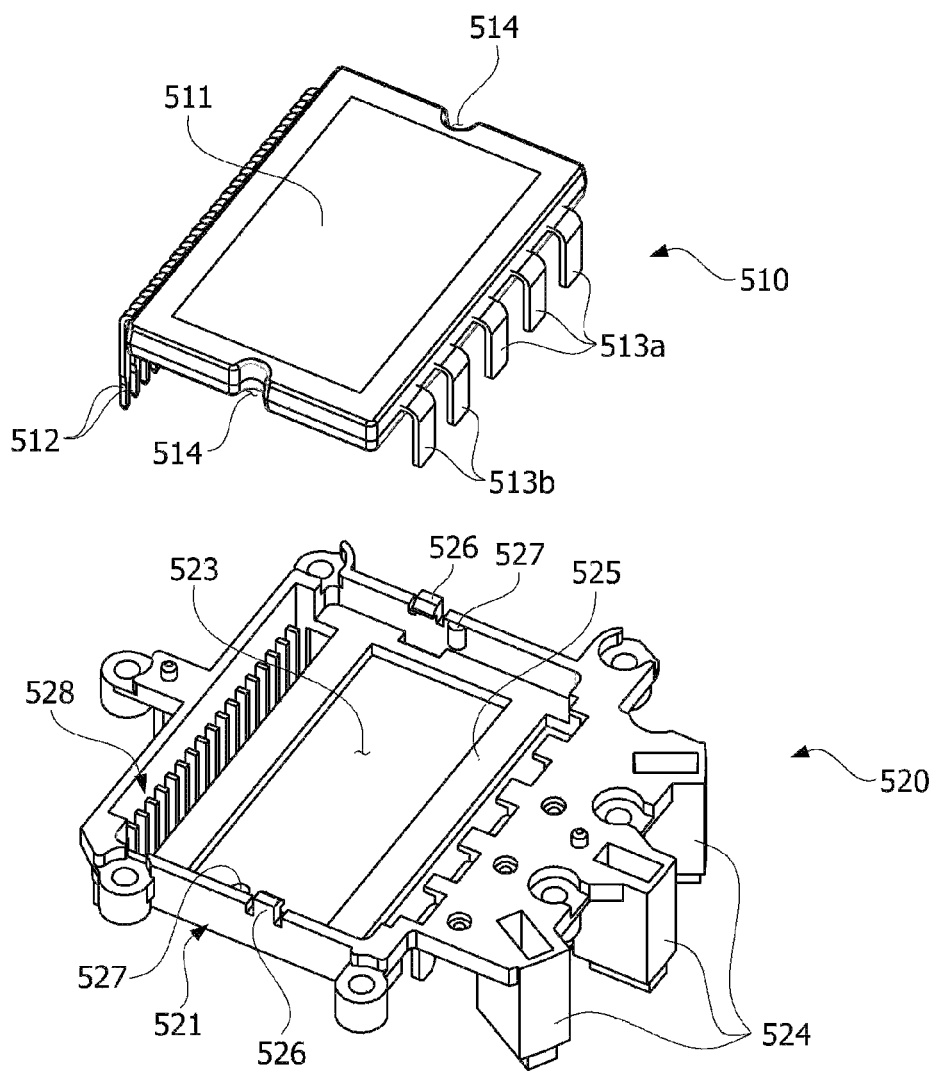

[FIG. 27]
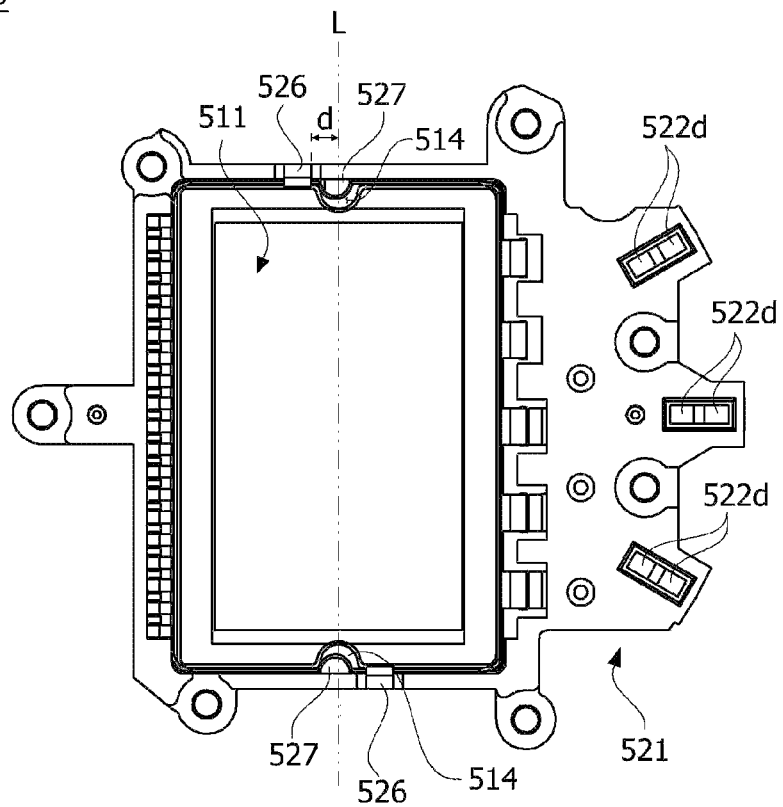

[FIG. 28]
500
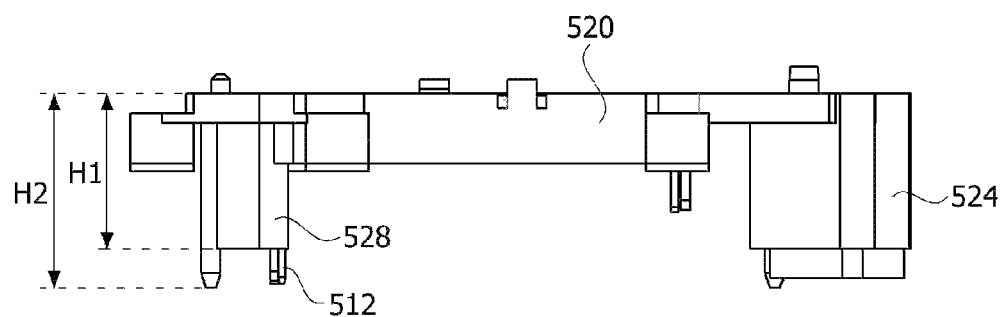

[FIG. 29]
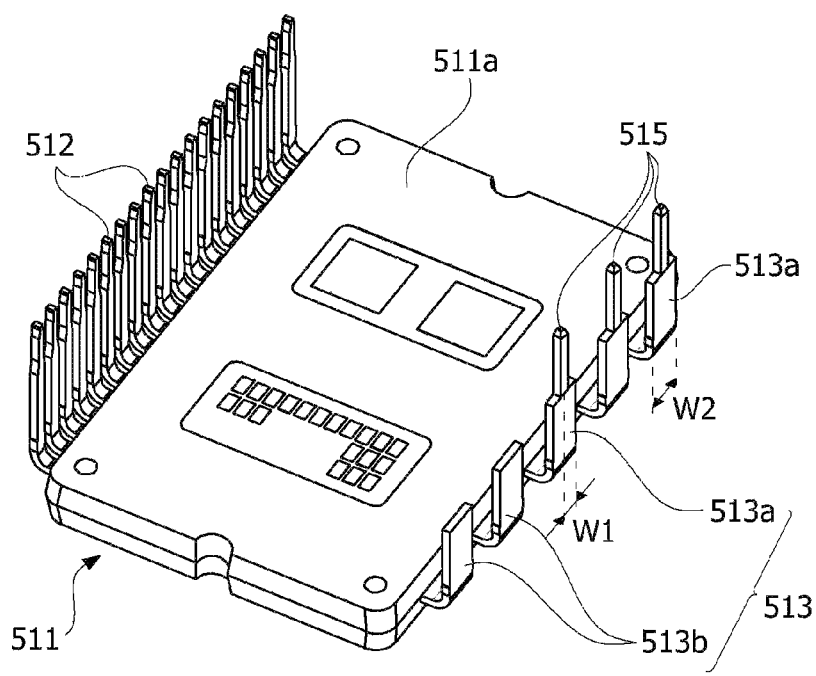

【FIG. 30】
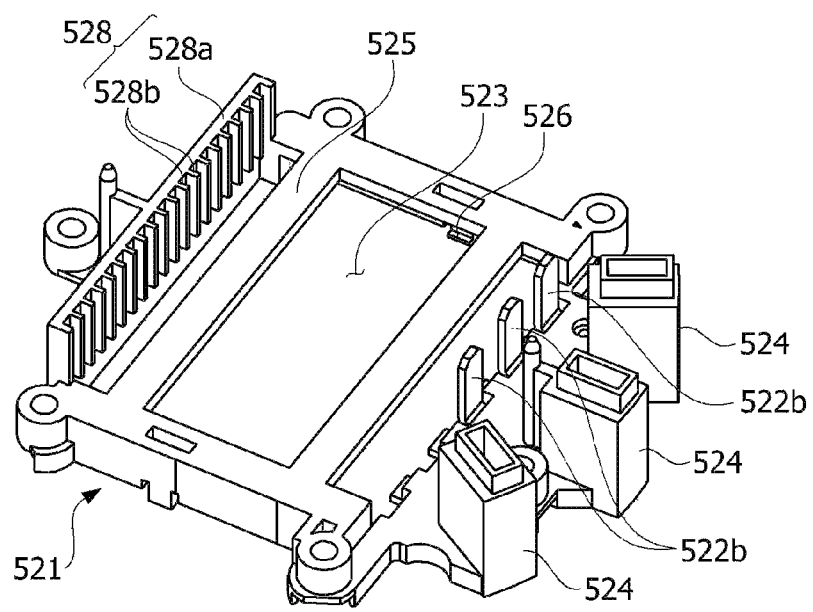

【FIG. 31】
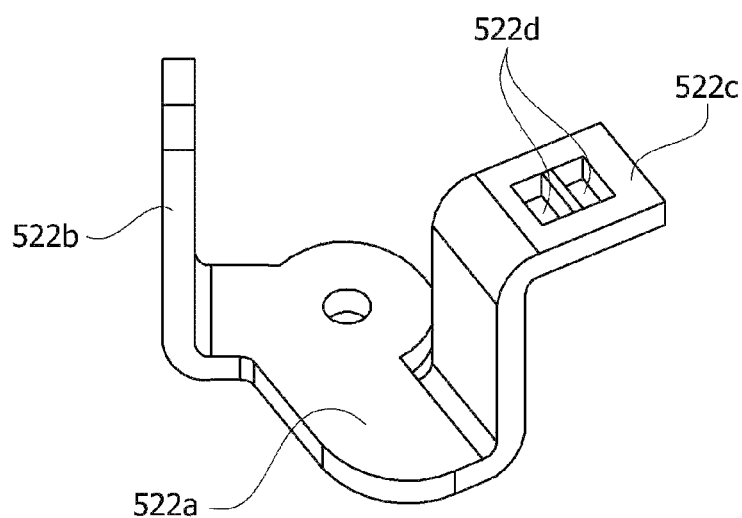
【FIG. 32】
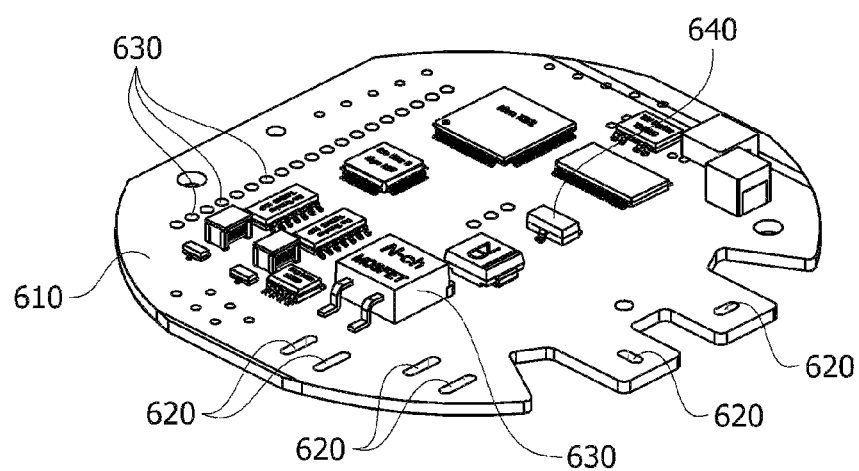

[FIG. 33]
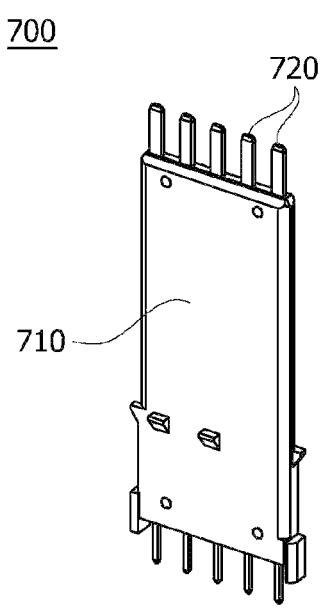

[FIG. 34]
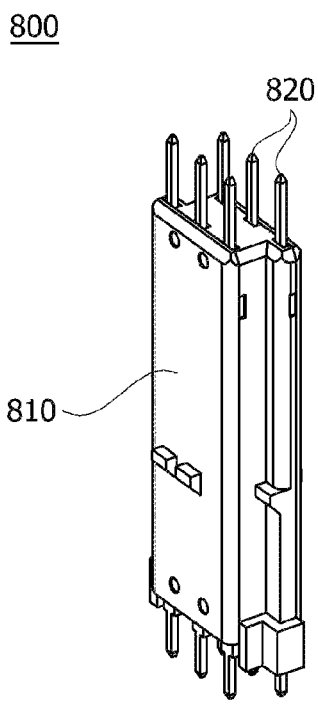

[FIG. 35]
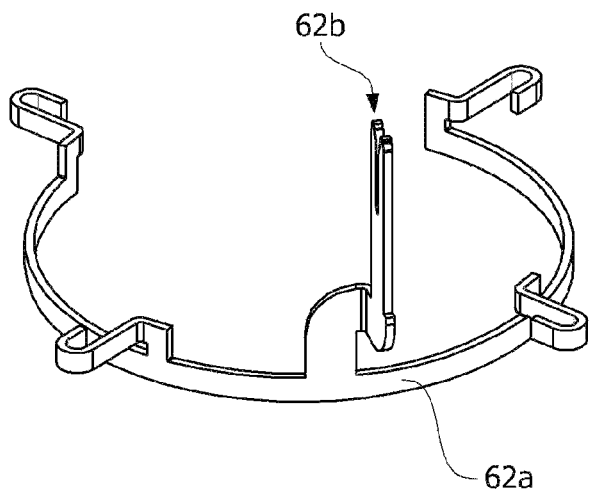

【FIG. 36】
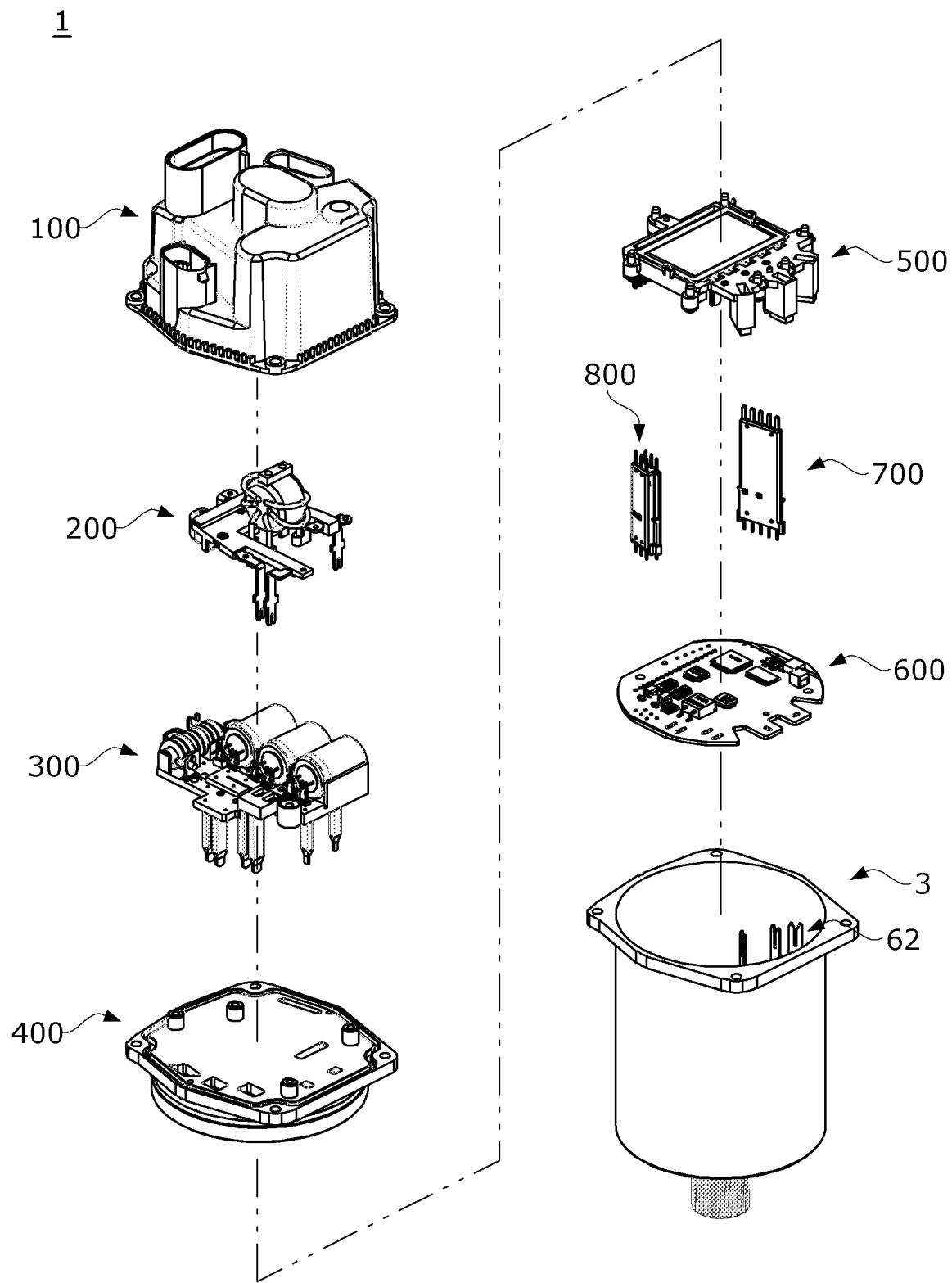

【FIG. 37】
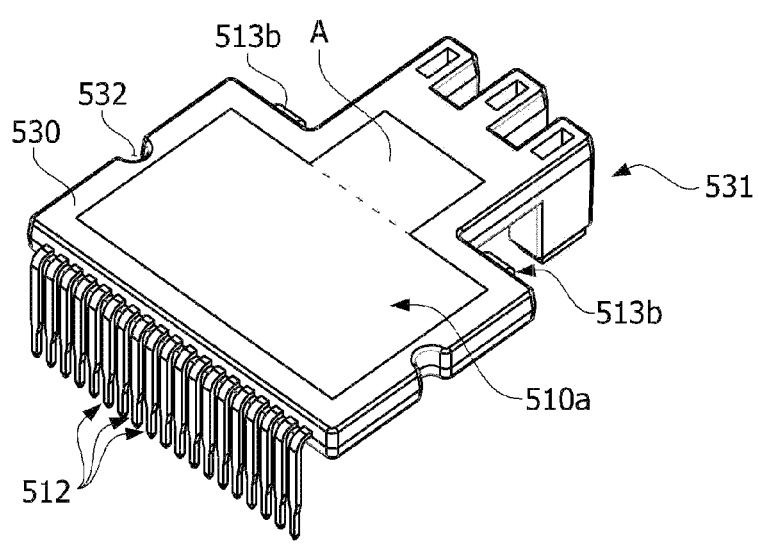

[FIG. 38]
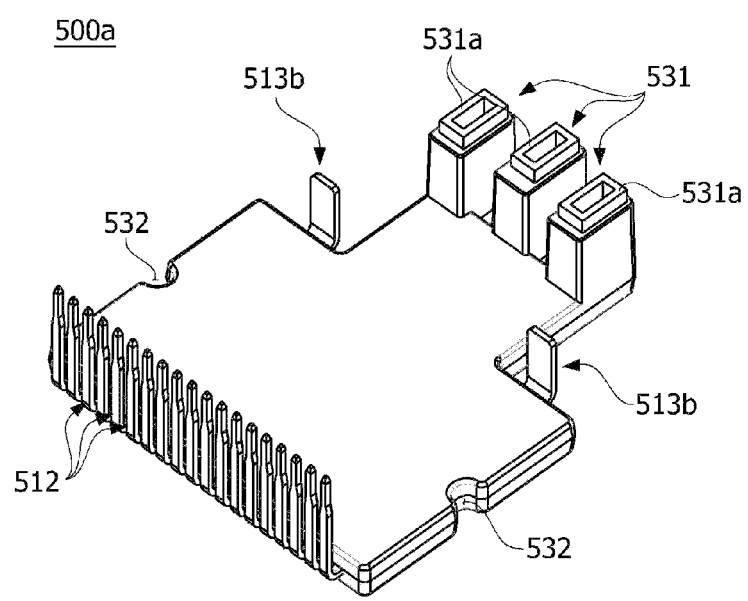

[FIG. 39]
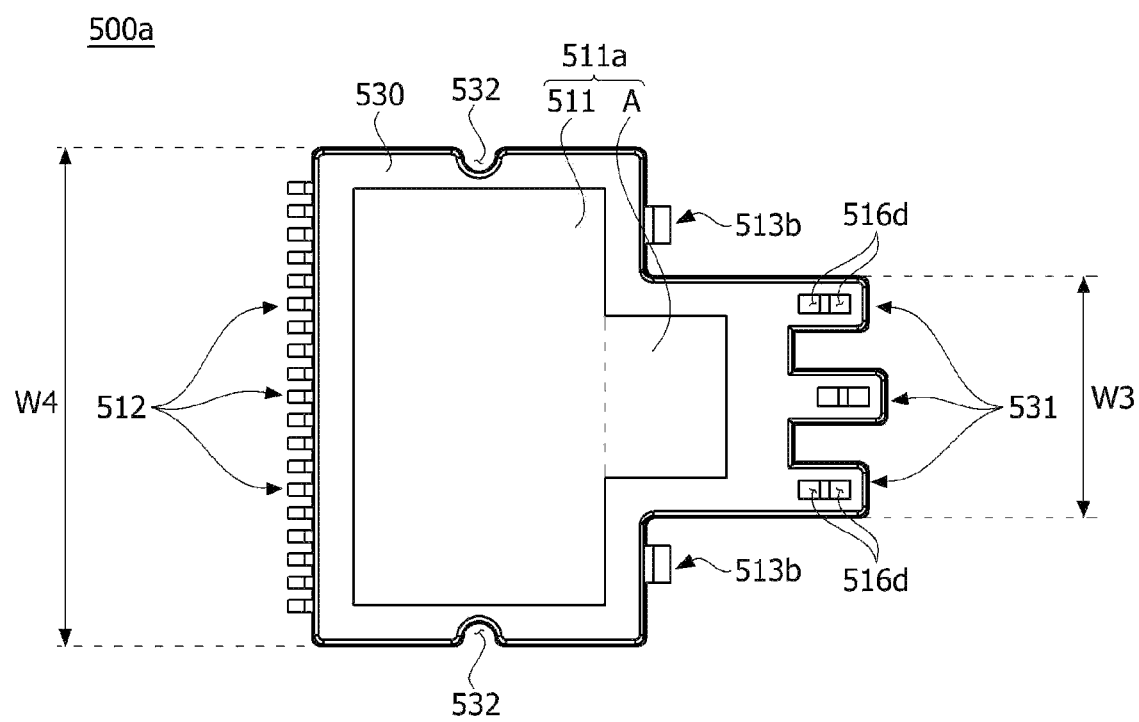

[FIG. 40]
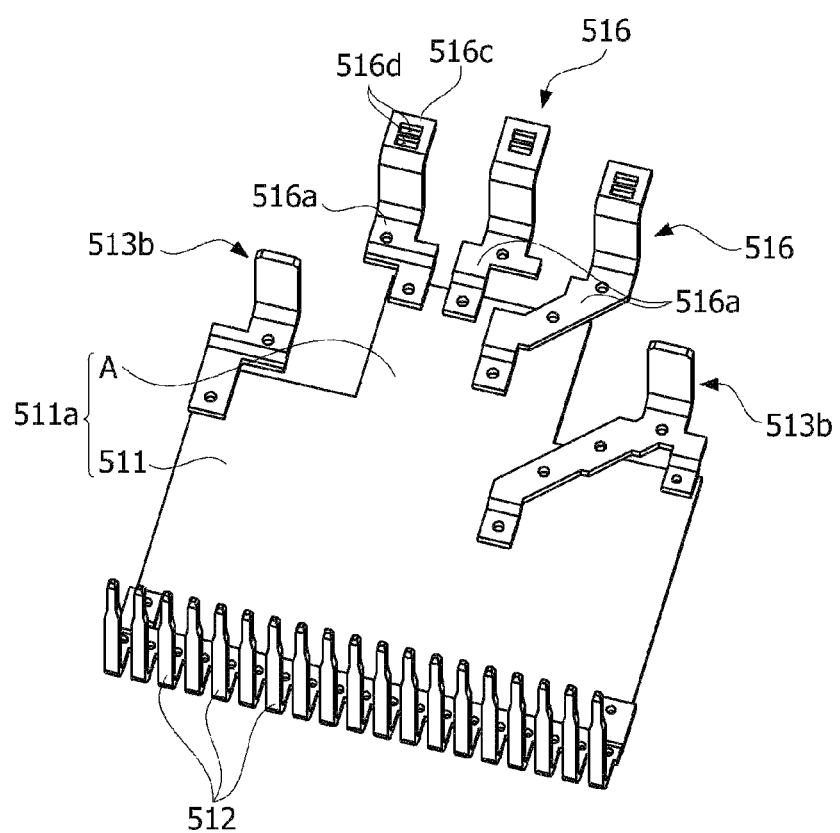

CONTROLLER AND MOTOR ASSEMBLY COMPRISING SAME

CROSS REFERENCE TO RELATED APPLICATIONS

This application is a Continuation of U.S. application Ser. No. 16/647,813 filed on Mar. 16, 2020 (now U.S. Pat. No. 11,545,878 issued on Jan. 3, 2023), which is the National Phase of PCT International Application No. PCT/KR2018/008514, filed on Jul. 27, 2018, which claims priority under 35 U.S.C. § 119(a) to Patent Application Nos. 10-2017-0128155, filed in the Republic of Korea on Sep. 29, 2017, 10-2017-0133853, filed in the Republic of Korea on Oct. 16, 2017, and 10-2017-0150611, filed in the Republic of Korea on Nov. 13, 2017, all of which are hereby expressly incorporated by reference into the present application.

TECHNICAL FIELD

An embodiment relates to a controller and a motor assembly including the same.

BACKGROUND ART

Motors are devices that convert electric energy into rotational energy using a force applied to a conductor in a magnetic field. Recently, with the expansion of the use of the motors, the role of the motor has become important. In particular, as vehicle electrification progresses rapidly, demands for the motor applied to a steering system, a braking system, an interior system, and the like are greatly increasing.

In the case of such a motor for a vehicle, a motor assembly including a controller capable of controlling the motor may be provided in the vehicle.

Since a high current is used in the controller, a heat-generation problem is emerging. For example, in the case of a substrate used in the controller, a direct current (DC) power circuit, a control circuit, and an inverter circuit are disposed on the substrate. In addition, a heat-generation problem occurs in the substrate as the high current is applied thereto. When the size of the substrate is increased to solve such a heat-generation problem, it is difficult to reduce the size and weight of the motor assembly.

Accordingly, there is a need for a motor assembly that is compact and solves a heat-generation problem occurring in the substrate.

Further, since the size of a controller is limited due to the user's request, there is a need for a motor assembly in which placement of elements and assembly of the elements within a limited size may be simplified.

SUMMARY

An embodiment is directed to providing a controller and a motor assembly in which a heat-generation problem may be solved while miniaturization and lightweighting are implemented.

An embodiment is also directed to providing a controller and a motor assembly in which some components may be shared.

Objectives to be achieved by the embodiments of the present invention are not limited to the above-described objectives, and other objectives which are not described above may be clearly understood by those skilled in the art through the following specification.

One aspect of the present invention provides a controller including a controller housing, a controller cover disposed on an opening of the controller housing, a differential-mode (DM) filter unit disposed above the controller cover, a common-mode (CM) filter unit disposed above the DM filter unit, a power module unit disposed below the controller cover, a substrate disposed below the power module unit, and a first connector and a second connector each having one side disposed on the substrate through the controller cover, wherein the power module unit includes a bracket, and a power module disposed between the bracket and the controller cover, wherein one surface of the power module is pressed against the controller cover, which is made of a metal material, by the bracket.

The power module may include a power module body, a plurality of first pins arranged to protrude downward from one side of the power module body, and five terminal pins arranged to protrude downward from the other side of the power module body, wherein an end portion of the first pin may be coupled to the substrate.

The bracket may include a bracket body having a cavity in which the power module is disposed and three fourth bosses protruding downward formed therein and three fourth terminals each having one side disposed to be exposed inside each of the fourth bosses and the other side disposed on the bracket body to protrude downward.

The bracket may further include a plate disposed below the bracket body to cross the cavity.

The bracket may further include at least two hooks protruding from the bracket body, and the power module may be fixed to the bracket by the hooks.

The hooks may be disposed to be spaced apart from each other at predetermined intervals on the basis of a virtual line L passing through a center of the power module.

A second groove may be formed on a lower surface of the controller cover such that an end portion of each of the hooks is disposed therein.

The bracket may further include a fourth protruding part protruding downward from the bracket body, and the fourth protruding part may be disposed adjacent to the first pin.

A protruding height of the first pin may be greater than a protruding height of the fourth protruding part.

A heat transfer member may be further disposed between the power module body and the controller cover.

The fourth terminal may include a fourth body disposed horizontally, a fourth frame formed to protrude downward from an end portion of one side of the fourth body, and a fourth end portion bent at an end portion of the other side of the fourth body and disposed inside the fourth boss, wherein the fourth frame may be in contact with the terminal pin.

A sixth hole may be formed in the fourth end portion.

Another aspect of the present invention provides a motor assembly including a controller and a motor, wherein the controller includes a controller housing, a controller cover disposed on an opening of the controller housing, a differential-mode (DM) filter unit disposed above the controller cover, a common-mode (CM) filter unit disposed above the DM filter unit, a power module unit disposed below the controller cover, a substrate disposed below the power module unit, and a first connector and a second connector each having one side disposed on the substrate through the controller cover, wherein the power module unit includes a bracket and a power module disposed between the bracket and the controller cover, wherein one side of the power module is pressed against the controller cover, which is made of a metal material, by the bracket.

The motor may include a rotation shaft, a rotor disposed outside the rotation shaft, a stator disposed outside the rotor; a bus bar disposed above the stator, a motor housing accommodating the rotor, the stator, and the bus bar, and a motor cover disposed on an opening of the motor housing, wherein the bus bar may include a bus-bar body and a bus-bar terminal, the bracket may include a bracket body having a cavity in which the power module is disposed and three fourth bosses protruding downward formed therein and three fourth terminals each having one side disposed to be exposed inside each of the fourth bosses and the other side disposed on the bracket body to protrude downward, and one side of the bus-bar terminal may be coupled to a sixth hole of the fourth terminal.

Still another aspect of the present invention provides a controller including a controller housing, a controller cover disposed on an opening of the controller housing, a differential-mode (DM) filter unit disposed above the controller cover, a common-mode (CM) filter unit disposed above the DM filter unit, a power module unit disposed below the controller cover, a substrate disposed below the power module unit, and a first connector and a second connector each having one side disposed on the substrate through the controller cover, wherein the power module unit includes a bracket and a power module disposed between the bracket and the controller cover, wherein the power module includes a power module body, a plurality of first pins arranged to protrude downward from one side of the power module body, five terminal pins arranged to protrude downward from the other side of the power module body, and a third protrusion protruding from an end portion of each of three terminal pins among the terminal pins, wherein an end portion of the third protrusion is coupled to the substrate.

An end portion of the first pin may be coupled to the substrate.

One surface of the power module may be pressed against the controller cover, which is made of a metal material, by the bracket.

The bracket may include a bracket body having a cavity in which the power module is disposed and three fourth bosses protruding downward formed therein and a fourth terminal having one side disposed to be exposed inside each of the fourth bosses and the other side disposed on the bracket body to protrude downward.

The fourth terminal may be in contact with the terminal pin on which the third protrusion is formed.

The bracket may further include a plate disposed below the bracket body to cross the cavity.

The bracket may further include at least two hooks protruding from the bracket body, and the power module may be fixed to the bracket by the hooks.

The hooks may be disposed to be spaced apart from each other at predetermined intervals on the basis of a virtual line L passing through a center of the power module.

A second groove may be formed on a lower surface of the controller cover such that an end portion of the hook is disposed therein.

The bracket may further include a fourth protruding part protruding downward from the bracket body, and the fourth protruding part may be disposed adjacent to the first pin.

A protruding height of the first pin may be greater than a protruding height of the fourth protruding part.

The fourth terminal may include a fourth body disposed horizontally, a fourth frame formed to protrude downward from an end portion of one side of the fourth body, and a fourth end portion bent at an end portion of the other side of the fourth body and disposed inside the fourth boss, wherein the fourth frame may be in contact with the terminal pin.

A sixth hole may be formed in the fourth end portion.

A heat transfer member may be further disposed between the power module body and the controller cover.

A width of the third protrusion may be less than that of the terminal pin.

Yet another aspect of the present invention provides a motor assembly including a controller and a motor, wherein the controller includes a controller housing, a controller cover disposed on an opening of the controller housing, a differential-mode (DM) filter unit disposed above the controller cover, a common-mode (CM) filter unit disposed above the DM filter unit, a power module unit disposed below the controller cover, a substrate disposed below the power module unit, and a first connector and a second connector each having one side disposed on the substrate through the controller cover, wherein the power module unit includes a bracket and a power module disposed between the bracket and the controller cover, wherein the power module includes a power module body, a plurality of first pins arranged to protrude downward from one side of the power module body, five terminal pins arranged to protrude downward from the other side of the power module body, and a third protrusion protruding from an end portion of each of three terminal pins among the terminal pins, wherein an end portion of the third protrusion is coupled to the substrate.

A width of the third protrusion may be less than that of the terminal pin.

One surface of the power module may be pressed against the controller cover, which is made of a metal material, by the bracket.

The motor may include a rotation shaft, a rotor disposed outside the rotation shaft, a stator disposed outside the rotor; a bus bar disposed above the stator, a motor housing accommodating the rotor, the stator, and the bus bar, and a motor cover disposed on an opening of the motor housing, wherein the bus bar may include a bus-bar body and a bus-bar terminal, the bracket may include a bracket body having a cavity in which the power module is disposed and three fourth bosses protruding downward formed therein and three fourth terminals each having one side disposed to be exposed inside each of the fourth bosses and the other side disposed on the bracket body to protrude downward, and one side of the bus-bar terminal may be coupled to a sixth hole of the fourth terminal.

The fourth terminal may be in contact with the terminal pin on which the third protrusion is formed.

Yet another aspect of the present invention provides a motor controller including a substrate, a controller housing disposed on the substrate, a common-mode (CM) filter unit disposed between the substrate and the controller housing, a differential-mode (DM) filter unit disposed below the CM filter unit, a controller cover disposed between the substrate and the DM filter unit, a power module unit disposed between the substrate and the controller cover, and a connector unit coupled to the substrate, wherein the power module unit includes a power module and a mold unit surrounding the power module, wherein the mold unit includes a boss part protruding from one side thereof.

The power module may include a power module body, a first pin coupled to one side of the power module body, and a terminal part coupled to the other side of the power module body, wherein an end portion of the first pin may be coupled to the substrate.

The terminal part may include two first power module terminals protruding toward an outside of the mold unit from the other side of the power module body and three second power module terminals each having one side connected to the other side of the power module body.

Each of the second power module terminals may include a body having one side end portion connected to the power module body, an end portion bent at the other side end portion of the body and disposed inside the boss part, and a hole formed in the end portion.

The boss part may be branched into three parts from the mold unit.

The boss part may protrude toward the substrate, and the other side of the second power module terminal may be disposed to be exposed inside the boss part.

A space may be formed at the inside of the boss part, and the space may be formed to pass through from a lower portion to an upper portion of the boss part.

A protruding part protruding downward may be further formed at a lower end of the boss part.

A width of one side of the mold unit on which the boss part is formed may be less than a width of the other side disposed to face the one side.

One side of the first power module terminal, which protrudes toward the outside of the mold unit, may be disposed to protrude downward.

The power module body may further include a protruding region protruding from one side thereof, and the protruding region may be disposed between the first power module terminals.

The other side of the first power module terminal may be connected to the protruding region.

The controller cover may be made of a metal material.

Yet another aspect of the present invention provides a motor assembly including a motor controller and a motor, wherein the motor controller includes a substrate, a controller housing disposed on the substrate, a common-mode (CM) filter unit disposed between the substrate and the controller housing, a differential-mode (DM) filter unit disposed below the CM filter unit, a controller cover disposed between the substrate and the DM filter unit, a power module unit disposed between the substrate and the controller cover, and a connector unit coupled to the substrate, wherein the power module unit includes a power module and a mold unit surrounding the power module, wherein the mold unit includes a boss part protruding from one side thereof.

The motor may include a rotation shaft, a rotor disposed outside the rotation shaft, a stator disposed outside the rotor; a bus bar disposed above the stator, a motor housing accommodating the rotor, the stator, and the bus bar, and a motor cover disposed on an opening of the motor housing, wherein the bus bar may include a bus-bar body and a bus-bar terminal, and the power module may include a power module body, a first pin coupled to one side of the power module body, two first power module terminals disposed to protrude downward from the other side of the power module body, and three second power module terminals each having one side connected to the other side of the power module body, wherein one side of the bus-bar terminal may be coupled to a hole of the second power module terminal.

The connector unit may include a first connector and a second connector, and each of the first connector and the second connector may pass through the controller cover.

One side of the first connector may be coupled to the substrate and the other side thereof may be disposed inside one boss of three bosses formed in the controller housing, and one side of the second connector may be coupled to the substrate and the other side thereof may be disposed inside another boss of the three bosses formed in the controller housing.

Advantageous Effects

A motor assembly including a controller according to an embodiment can solve a heat-generation problem by pressing a power module generating a great amount of heat against a controller cover made of a metal material.

Further, space can be utilized and material costs and mold costs can be reduced by placing a mold unit in a power module through an insert injection method.

Further, the size of a power module can be increased by placing a mold unit in a power module through an insert injection method, thereby improving a degree of the design freedom of the power module. Furthermore, in the power module having an increased size, the contact area with a controller cover can be increased to improve heat dissipation performance.

Further, a controller and a motor assembly can be implemented in a compact structure by vertically disposing an element having a large size.

Further, whenever the different types of motors are coupled to a controller, only a substrate can be replaced together with the motor so that some components of the controller can be shared.

Further, the reverse connection of power can be prevented by using a metal-oxide-semiconductor field-effect transistor (MOSFET) disposed on the substrate. Accordingly, the reliability of the stability of a motor assembly can be improved.

Various and beneficial advantages and effects of the embodiment are not limited to the above descriptions and will be more easily understood in a process of describing specific embodiments of the present invention.

BRIEF DESCRIPTION OF THE DRAWINGS

FIG. 1 is a perspective view of a motor assembly according to an embodiment.

FIG. 2 is an exploded perspective view of the motor assembly according to the embodiment in which a power module unit according to a first embodiment is disposed.

FIG. 3 is a cross-sectional view illustrating the motor assembly according to the embodiment.

FIG. 4 is a plan view of the motor assembly according to the embodiment.

FIG. 5 is a perspective view illustrating a controller housing of the motor assembly according to the embodiment.

FIG. 6 is a bottom perspective view illustrating the controller housing of the motor assembly according to the embodiment.

FIG. 7 is a perspective view illustrating a common-mode (CM) filter unit of the motor assembly according to the embodiment.

FIG. 8 is a bottom perspective view illustrating the CM filter unit of the motor assembly according to the embodiment.

FIG. 9 is a view illustrating a second terminal, a (2-1)th terminal, a (2-2)th terminal, a CM filter, and a first capacitor of the CM filter unit according to the embodiment.

FIG. 10 is a view illustrating an arrangement relationship between a first terminal of the controller housing and the second terminal of the CM filter unit of the motor assembly according to the embodiment.

FIG. 11 is a view illustrating an arrangement relationship between a first protrusion of the controller housing and a first hole of the CM filter unit in the motor assembly according to the embodiment.

FIG. 12 is a view illustrating a relationship in which a first protrusion of the controller housing of the motor assembly according to the embodiment is fused and fixed to a first hole.

FIG. 13 is a perspective view illustrating a differential-mode (DM) filter unit of the motor assembly according to the embodiment.

FIG. 14 is an exploded perspective view illustrating the DM filter unit of the motor assembly according to the embodiment.

FIG. 15 is a bottom perspective view illustrating the DM filter unit of the motor assembly according to the embodiment.

FIG. 16 is a plan view illustrating the DM filter unit of the motor assembly according to the embodiment.

FIG. 17 is a view illustrating a third terminal, a (3-1)th terminal, a (3-2)th terminal, a (3-3)th terminal, a DM filter, and a second capacitor of the DM filter unit according to the embodiment.

FIG. 18 is a bottom perspective view illustrating the third terminal, the (3-1)th terminal, the (3-2)th terminal, the (3-3)th terminal, the DM filter, and the second capacitor of the DM filter unit according to the embodiment.

FIG. 19 is a view illustrating a state in which the CM filter unit and the DM filter unit of the motor assembly according to the embodiment are coupled to each other.

FIG. 20 is a perspective view illustrating a controller cover of the motor assembly according to the embodiment.

FIG. 21 is a bottom perspective view illustrating the controller cover of the motor assembly according to the embodiment.

FIG. 22 is a bottom view illustrating the controller cover of the motor assembly according to the embodiment.

FIG. 23 is an enlarged view of region A in FIG. 3.

FIG. 24 is a perspective view illustrating the power module unit according to the first embodiment of the motor assembly according to the embodiment.

FIG. 25 is a bottom perspective view illustrating the power module unit according to the first embodiment of the motor assembly according to the embodiment.

FIG. 26 is an exploded perspective view illustrating the power module unit according to the first embodiment of the motor assembly according to the embodiment.

FIG. 27 is a plan view illustrating the power module unit according to the first embodiment of the motor assembly according to the embodiment.

FIG. 28 is a side view illustrating the power module unit according to the first embodiment of the motor assembly according to the embodiment.

FIG. 29 is a view illustrating a power module of the power module unit according to the first embodiment.

FIG. 30 is a view illustrating a bracket of the power module unit according to the first embodiment.

FIG. 31 is a view illustrating a fourth terminal of the power module unit according to the first embodiment.

FIG. 32 is a view illustrating a substrate of the motor assembly according to the embodiment.

FIG. 33 is a view illustrating a first connector of the motor assembly according to the embodiment.

FIG. 34 is a view illustrating a second connector of the motor assembly according to the embodiment.

FIG. 35 is a view illustrating a bus-bar terminal of the motor assembly according to the embodiment.

FIG. 36 is an exploded perspective view illustrating a motor according to the embodiment in which a power module unit according to a second embodiment is disposed.

FIG. 37 is a perspective view illustrating the power module unit according to the second embodiment of the motor assembly according to the embodiment.

FIG. 38 is a bottom perspective view illustrating the power module unit according to the second embodiment of the motor assembly according to the embodiment.

FIG. 39 is a plan view illustrating the power module unit according to the second embodiment of the motor assembly according to the embodiment.

FIG. 40 is a view illustrating a power module of the power module unit according to the second embodiment.

DETAILED DESCRIPTION

Hereinafter, exemplary embodiments of the present invention will be described in detail with reference to the accompanying drawings.

However, the technical spirit of the present invention is not limited to some embodiments which will be described herein and may be realized using various other embodiments, and at least one element of the embodiments may be selectively coupled, substituted, and used to realize the technical spirit within the range of the technical spirit.

Further, unless clearly and specifically defined otherwise by context, all terms (including technical and scientific terms) used herein can be interpreted as having customary meanings to those skilled in the art, and meanings of generally used terms, such as those defined in commonly used dictionaries, will be interpreted by considering contextual meanings of the related technology.

Further, the terms used in the embodiments of the present invention are provided only to describe embodiments of the present invention and not for limiting the present invention.

In the present specification, the singular forms include the plural forms unless the context clearly indicates otherwise, and the phrase "at least one element (or one or more elements) of an element A, an element B, and an element C" should be understood as including the meaning of at least one of all combinations being obtained by combining the element A, the element B, and the element C.

Further, in describing elements of the embodiments of the present invention, the terms such as first, second, A, B, (a), (b), and the like may be used.

These terms are merely for distinguishing one element from other elements, and the essential, order, sequence, and the like of corresponding elements are not limited by the terms.

In addition, when an element is referred to as being "connected or coupled" to another element, such a description may include both a case in which the element is directly connected or coupled to another element, and a case in which the element is connected or coupled to another element with still another element disposed therebetween.

Further, when an element is described as being formed or disposed "on (above)" or "under (below)" another element, the term "on (above)" or "under (below)" includes a case in which two elements are in direct contact with each other and a case in which one or more elements are (indirectly) disposed between two elements. Also, being "above (on) or below (beneath)" may include not only an upward direction but also a downward direction on the basis of one element.

Hereinafter, the embodiments will be described in detail with reference to the accompanying drawings. However, equal or corresponding elements will be referred to as the same reference numerals regardless of drawing signs, and a repetitive description thereof will be omitted.

FIG. 1 is a perspective view of a motor assembly according to an embodiment.

A motor assembly 1 according to the embodiment may include a controller 2 and a motor 3 according to the embodiment. Here, the controller 2 is a motor controller configured to control the motor 3.

Here, the motor 3 may be detachably disposed at a lower portion of the controller 2. Accordingly, various motors 3 may be connected to the controller 2 even when some components of the controller 2 are shared. Here, a substrate may be replaceably disposed between the controller 2 and the motor 3. Thus, whenever the different types of motors 3 are coupled, only the substrate may be replaced together with the motor 3 so that some components of the controller 2 may be shared.

FIG. 2 is an exploded perspective view of the motor assembly according to the embodiment in which a power module unit according to a first embodiment is disposed, FIG. 3 is a cross-sectional view illustrating the motor assembly according to the embodiment, and FIG. 4 is a plan view of the motor assembly according to the embodiment. Here, FIG. 3 may be a cross-sectional view taken along line A-A in FIG. 1.

Referring to FIGS. 1 to 3, the controller 2 may include a controller housing 100, a common-mode (CM) filter unit 200, a differential-mode (DM) filter unit 300, a controller cover 400, a power module unit 500 according to the first embodiment, a substrate 600, and a connector unit. Here, the connector unit may include a first connector 700 and a second connector 800. Here, the controller housing 100 may be referred to as a first housing. In addition, the controller cover 400 may be referred to as a first cover unit.

The connector unit may pass through the controller cover 400. Here, the connector unit may pass through the controller cover 400 to be spaced apart from an outer side of the power module unit 500. For example, one side of each of the first connector 700 and the second connector 800 disposed through the controller cover 400 may be disposed on the substrate 600. As illustrated in FIG. 4, the other side of the first connector 700 may be disposed inside one boss of three bosses formed in the controller housing 100, and the other side of the second connector 800 may be disposed inside another boss of the three bosses.

The controller 2 receives power through an external connector. In addition, the power is transferred to the substrate 600 through the CM filter unit 200 and the DM filter unit 300. In addition, the power in which the reverse connection is prevented at the substrate 600 is transferred to the DM filter unit 300 and then supplied to the power module unit 500 and the substrate 600.

The controller housing 100 and the controller cover 400 disposed on an opening of the controller housing 100 may form an outer shape of the controller 2. Here, the controller housing 100 may be disposed on the substrate 600.

An accommodation space may be formed therein by combining the controller housing 100 and the controller cover 400. The CM filter unit 200 and the DM filter unit 300 may be disposed in the accommodation space.

FIG. 5 is a perspective view illustrating the controller housing of the motor assembly according to the embodiment, and FIG. 6 is a bottom perspective view illustrating the controller housing of the motor assembly according to the embodiment.

Referring to FIGS. 5 and 6, the controller housing 100 may include a controller housing body 110 and a first terminal 120. Here, the controller housing body 110 may be referred to as a first body. In addition, the first terminal 120 may be referred to as a controller housing terminal.

The controller housing body 110 may be formed in a cylindrical shape such that an accommodation space is formed therein. Openings may be formed in the controller housing body 110 for the arrangement of the CM filter unit 200 and the DM filter unit 300.

A first boss 111, a second boss 112, a third boss 113, a plurality of first protrusions 114, and a first protruding part 115 may be formed in the controller housing body 110. Here, the first boss 111, the second boss 112, the third boss 113, the first protrusions 114, and the first protruding part 115 may be integrally formed with the controller housing body 110.

The first boss 111, the second boss 112, and the third boss 113 may be formed to protrude from an upper portion of the controller housing body 110. Here, the first boss 111, the second boss 112, and the third boss 113 may be disposed to be spaced apart from each other.

A space may be formed in each of the first boss 111, the second boss 112, and the third boss 113, and an external connector (not shown), through which power or signals from the outside may be transmitted and received, may be connected to each of the first boss 111, the second boss 112, and the third boss 113. Accordingly, each of the first boss 111, the second boss 112, and the third boss 113 may be formed in various shapes depending on the shape of the external connector.

As illustrated in FIG. 6, the plurality of first protrusions 114 may be formed to protrude downward from an inner surface 116 of a lower side of the controller housing body 110. Thus, the CM filter unit 200 may be coupled to a lower portion of the controller housing 100 through the first protrusions 114.

The first protruding part 115 may be formed to protrude downward from an end portion of the controller housing body 110. In addition, the first protruding part 115 may be coupled to the controller cover 400.

As illustrated in FIG. 4, two first terminals 120 may be provided.

The first terminal 120 may be disposed in the controller housing body 110 through an insert injection method. As illustrated in FIG. 4, the first terminal 120 may be disposed inside the first boss 111. Here, the first terminal 120 may be made of a metal material. Accordingly, the first terminal 120 may be formed by press processing a sheet metal such as a copper plate.

Power may be applied to the first terminal 120 through the external connector coupled to the first boss 111.

Referring to FIGS. 4 and 6, one side of the first terminal 120 may be disposed inside the first boss 111, and an end portion 121 of the other side of the first terminal 120 may be disposed to protrude downward from the inner surface 116 of the controller housing body 110. As illustrated in FIG. 6, the first terminal 120 may be fixed to an inside of the controller housing body 110 by a coupling member 4 such as a bolt or a screw.

Meanwhile, the controller housing body 110 in which the first boss 111, the second boss 112, and the third boss 113 are formed may be made of a synthetic resin material. Accordingly, the controller housing body 110 may be formed in various shapes according to a design thereof and enable lightweighting of the motor assembly 1.

FIG. 7 is a perspective view illustrating the CM filter unit of the motor assembly according to the embodiment, FIG. 8 is a bottom perspective view illustrating the CM filter unit of the motor assembly according to the embodiment, FIG. 10 is a view illustrating an arrangement relationship between the first terminal of the controller housing and a second terminal of the CM filter unit in the motor assembly according to the embodiment, FIG. 11 is a view illustrating an arrangement relationship between the first protrusion of the controller housing and a first hole of the CM filter unit in the motor assembly according to the embodiment, and FIG. 12 is a view illustrating a relationship in which the first protrusion of the controller housing of the motor assembly according to the embodiment is fused and fixed to the first hole.

The CM filter unit 200 may be disposed above the DM filter unit 300. The CM filter unit 200 may be disposed between the controller housing 100 and the substrate 600. Here, the CM filter unit 200 may be disposed below the inner surface 116 of the controller housing 100.

Referring to FIGS. 7 to 9, the CM filter unit 200 may include a CM filter unit body 210, a second terminal 220, a (2-1)th terminal 230, a (2-2)th terminal 240, a CM filter 250, and two first capacitors 260. First holes 225, 235, and 245 may be formed in the second terminal 220, the (2-1)th terminal 230, and the (2-2)th terminal 240, respectively. Here, the CM filter unit body 210 may be referred to as a second body, and the first capacitors 260 may be referred to as CM filter unit capacitors. In addition, the first holes 225, 235, and 245 may be referred to as fixing holes.

The CM filter unit body 210 may be made of a synthetic resin material, and the second terminal 220, the (2-1)th terminal 230, and the (2-2)th terminal 240 may be made of a metal material. Accordingly, the second terminal 220, the (2-1)th terminal 230, and the (2-2)th terminal 240 may be disposed in the CM filter unit body 210 through an insert injection method. Here, the second terminal 220, the (2-1)th terminal 230, and the (2-2)th terminal 240 may be preferentially formed by press processing a sheet metal such as a copper plate.

The CM filter unit body 210 may be formed in a shape.

A second hole 211 may be formed in the CM filter unit body 210. Here, the second hole 211 may be referred to as a guide hole.

The first protrusion 114 of the controller housing 100 may be disposed in the second hole 211. Accordingly, since the CM filter unit body 210 may be disposed in the controller housing 100 in the manner of inserting the second hole 211 into the first protrusion 114, the assembly position of the CM filter unit 200 is restricted. Further, the coupling of the first protrusion 114 and the second hole 211 prevents the movement of the CM filter unit 200 in a horizontal direction.

The second terminal 220 has one side in contact with the end portion 121 of the other side of the first terminal 120 and the other side in contact with the CM filter 250 to be electrically connected. Here, two second terminal 220 may be provided to correspond to the number of the first terminals 120.

The second terminal 220 may include a second body 221 disposed horizontally, a second frame 222 protruding downward from an end portion of one side the second body 221, a second bent portion 223 formed by bending an end portion of the other side of the second body 221, a second end portion 224, and a first hole 225.

The second frame 222, which is an end portion of one side of the second terminal 220 in contact with the first terminal 120, may be formed by bending one side of the second body 221 downward. As illustrated in FIG. 10, the end portion 121 of one side of the first terminal 120, which is disposed to protrude downward from the inner surface 116, is in contact with the second frame 222 of the second terminal 220, which is bent downward. Here, the contact force between the end portion 121 of one side of the first terminal 120 and the second frame 222 of the second terminal 220 may be improved through a fusing process.

The second bent portion 223, which is one of end portions of the other side of the second terminal 220, is connected to a first wire 251 disposed in the CM filter 250. To this end, the second bent portion 223 formed on the other side of the second body 221 may be formed in a hook shape, and the first wire 251 may be electrically connected to the other side of the second terminal 220 through a fusing process. Here, the first wire 251 may be referred to as a first CM filter wire.

The second end portion 224 branched from the other side of the second terminal 220 is electrically connected to a second wire 261 disposed on the first capacitor 260. For example, the second end portion 224 may be formed in a shape in which two protrusions are disposed to be spaced apart from each other, and as illustrated in FIG. 8, the second wire 261 may be disposed between the protrusions. Here, the second wire 261 may be electrically connected to the second end portion 224 of the second terminal 220 through a fusing process. Here, the second wire 261 may be referred to as a second CM filter wire.

Referring to FIGS. 7 to 9, the first hole 225 may be formed in the second terminal 220.

As illustrated in FIG. 11, the first protrusion 114 of the controller housing 100 may be disposed in the first hole 225. Accordingly, the first hole 225 may be coupled to the first protrusion 114 in the manner of inserting the first hole 225 into the first protrusion 114.

Then, an end portion of the first protrusion 114 may be fused to the second terminal 220 by heating, as illustrated in FIG. 12. Accordingly, the CM filter unit 200 may be fixed to the controller housing 100. Here, since the first protrusion 114 is made of a synthetic resin material and the second terminal 220 is made of a metal material, thermal fusion is possible.

One side of the (2-1)th terminal 230 is bent toward the DM filter unit 300, and the other side of the (2-1)th terminal 230 is electrically connected to the CM filter 250 by being in contact therewith. Here, two (2-1)th terminals 230 may be provided.

The (2-1)th terminal 230 may include a (2-1)th body 231 disposed horizontally, a (2-1)th frame 232 protruding downward from an end portion of one side of the (2-1)th body 231, a (2-1)th bent portion 233 formed by bending an end portion of the other side of the (2-1)th body 231, and a first hole 235.

The (2-1)th frame 232 may be formed by bending the end portion of one side of the (2-1)th body 231 downward. The (2-1)th frame 232, which is an end portion of one side of the (2-1)th terminal 230 bent downward, may be coupled to a third terminal 320 of the DM filter unit 300. Here, two (2-1)th protrusions 234 may be disposed on the (2-1)th frame 232 to be spaced apart from each other. Accordingly, the coupling force and contact force between the (2-1)th protrusion 234 and the third terminal 320 may be improved.

The other side of the (2-1)th terminal 230 is connected to the first wire 251 disposed in the CM filter 250. To this end, the (2-1)th bent portion 233 of the (2-1)th terminal 230 may be formed in a hook shape, and the first wire 251 may be electrically connected to the other side of the (2-1)th terminal 230 through a fusing process.

Referring to FIGS. 7 to 9, the first hole 235 may be formed in the (2-1)th terminal 230.

As illustrated in FIG. 11, the first protrusion 114 of the controller housing 100 may be disposed in the first hole 235.

Accordingly, the first hole 235 may be coupled to the first protrusion 114 in the manner of inserting the first hole 235 into the first protrusion 114.

Then, an end portion of the first protrusion 114 may be fused to the (2-1)th terminal 230 by heating, as illustrated in FIG. 12. Accordingly, the CM filter unit 200 may be fixed to the controller housing 100.

The (2-2)th terminal 240 may perform a grounding function.

One side of the (2-2)th terminal 240 is bent toward the DM filter unit 300, and the other side of the (2-2)th terminal 240 is electrically connected to the first capacitor 260 by being in contact therewith. Here, an end portion 242 of the other side of the (2-2)th terminal 240 may be branched to be connected to each of the two first capacitor 260.

The (2-2)th terminal 240 may include a (2-2)th body 241 disposed horizontally, a (2-2)th frame 242 protruding downward from an end portion of one side of the (2-2)th body 241, a (2-2)th end portion 244, and a first hole 245.

The (2-2)th frame 242 may be formed by bending one side of the (2-2)th body 241 downward. The (2-2)th frame 242, which is an end portion of one side of the (2-2)th terminal 240 bent downward, may be coupled to a (3-3)th terminal 350 of the DM filter unit 300. Here, two (2-2)th protrusions 243 may be further disposed on the (2-2)th frame 242 to be spaced apart from each other. Accordingly, the coupling force and contact force between the (2-2)th protrusion 243 and a (3-4)th terminal 360 may be improved.

The other side of the (2-2)th terminal 240 is electrically connected to the second wire 261 disposed in the first capacitor 260. To this end, the (2-2)th end portion 244, which is an end portion of the other side of the (2-2)th terminal 240, may be formed in a shape in which two protrusions are disposed to be spaced apart from each other, and the second wire 261 may be disposed between the protrusions, as illustrated in FIG. 8. Here, the second wire 261 may be electrically connected to the other side of the (2-2)th terminal 240 through a fusing process.

Referring to FIGS. 7 to 9, the first hole 245 may be formed in the (2-2)th terminal 240.

As illustrated in FIG. 11, the first protrusion 114 of the controller housing 100 may be disposed in the first hole 245. Accordingly, the first hole 245 may be coupled to the first protrusion 114 in the manner of inserting the first hole 245 into the first protrusion 114.

Then, an end portion of the first protrusion 114 may be fused to the (2-2)th terminal 240 by heating as illustrated in FIG. 12. Accordingly, the CM filter unit 200 may be fixed to the controller housing 100.

The CM filter 250 may be disposed between the second terminal 220 and the (2-1)th terminal 230. Here, the CM filter 250 may be disposed above the CM filter unit body 210 and may be disposed between two legs of the CM filter unit body 210 disposed horizontally to be spaced apart from each other.

The CM filter 250 may reduce a CM noise. For example, the second terminal 220 electrically connected to the first terminal 120 may be used as a power line, and the CM filter 250 may reduce the CM noise, which is caused by a CM current component, among conductive noises generated through the second terminal 220 being used as the power line.

As illustrated in FIG. 7, a plurality of first wires 251 may be arranged in the CM filter 250, and the first wires 251 may be electrically connected to the second terminals 220 and the (2-1)th terminal 230 at the space between the legs.

The first capacitor 260 may be disposed below the CM filter unit body 210. Here, a plurality of second wires 261 arranged in the first capacitor 260 may be electrically connected to each of the second terminal 220 and the (2-2)th terminal 240.

FIG. 13 is a perspective view illustrating the DM filter unit of the motor assembly according to the embodiment, FIG. 14 is an exploded perspective view illustrating the DM filter unit of the motor assembly according to the embodiment, FIG. 15 is a bottom perspective view illustrating the DM filter unit of the motor assembly according to the embodiment, FIG. 16 is a plan view illustrating the DM filter unit of the motor assembly according to the embodiment, FIG. 17 is a view illustrating a third terminal, a (3-1)th terminal, a (3-2)th terminal, a (3-3)th terminal, a DM filter, and a second capacitor of the DM filter unit according to the embodiment, FIG. 18 is a bottom perspective view illustrating the third terminal, the (3-1)th terminal, the (3-2)th terminal, the (3-3)th terminal, the DM filter, and the second capacitor of the DM filter unit according to the embodiment, and FIG. 19 is a view illustrating a state in which the CM filter unit and the DM filter unit of the motor assembly according to the embodiment are coupled to each other.

The DM filter unit 300 may be disposed above the controller cover 400. Here, the DM filter unit 300 may be disposed below the CM filter unit 200.

Referring to FIGS. 13 to 17, the DM filter unit 300 may include a DM filter unit body 310, the third terminal 320, a (3-1)th terminal 330, a (3-2)th terminal 340, the (3-3)th terminal 350, the (3-4)th terminal 360, a DM filter 370, and three second capacitors 380. Here, the DM filter unit body 310 may be referred to as a third body, and the second capacitors 380 may be referred to as DM filter unit capacitors.

The DM filter unit body 310 may be made of a synthetic resin material, and the third terminal 320, the (3-1)th terminal 330, the (3-2)th terminal 340, the (3-3)th terminal 350, and the (3-4)th terminal 360 may be made of a metal material. Accordingly, the third terminal 320, the (3-1)th terminal 330, the (3-2)th terminal 340, the (3-3)th terminal 350, and the (3-4)th terminal 360 may be disposed in the DM filter unit body 310 through an insert injection method. Here, the third terminal 320, the (3-1)th terminal 330, the (3-2)th terminal 340, the (3-3)th terminal 350, and the (3-4)th terminal 360 may be preferentially formed by press processing a sheet metal such as a copper plate.

A fourth hole 311 and a plurality of second protruding parts 312 may be formed in the DM filter unit body 310. Here, the fourth hole 311 may be referred to as a fastening hole.

The DM filter unit 300 may be fixed to the controller cover 400 by the coupling member 4 being disposed in the fourth hole 311.

The second protruding part 312 may be formed to protrude downward from the DM filter unit body 310. Here, the second protruding parts 312 may be integrally formed with the DM filter unit body 310.

The second protruding parts 312 may be disposed to pass through the controller cover 400. Accordingly, the third terminal 320, the (3-1)th terminal 330, the (3-2)th terminal 340, and the (3-3)th terminal 350, each having one region disposed inside the second protruding part 312, may be insulated from the controller cover 400.

The third terminal 320 electrically connects the (2-1)th terminal 230 to the substrate 600. Here, two third terminals 320 may be provided. In addition, one region of the third terminal 320 may pass through the controller cover 400. To this end, a hole may be formed in the controller cover 400.

The third terminal 320 may include a third body 321 disposed horizontally, a third frame 322 protruding downward from an end portion of one side of the third body 321, and a third hole 323.

The third hole 323 may be formed in each of the third bodies 321. Here, the third hole 323 may be referred to as a coupling hole.

As illustrated in FIG. 19, the (2-1)th frame 232, which is an end portion of one side of the (2-1)th terminal 230, may be coupled to the third hole 323.

When two third hole 323 are formed, the (2-1)th protrusions 234 formed on the (2-1)th frame 232 may be coupled to the third holes 323. Accordingly, the coupling force and contact force between the (2-1)th terminal 230 and the third terminal 320 may be improved.

One region of the third terminal 320 may be bent toward the substrate 600. For example, the third frame 322, which is a bent end portion of one side of the third terminal 320, may be formed by being bent downward.

The third frame 322 of the third terminal 320 may be disposed to protrude from an end portion of the second protruding part 312. Here, the second protruding part 312 is disposed to surround one region of the third frame 322 so that the third terminal 320 is insulated from the controller cover 400.

In addition, an end portion of the third frame 322 exposed from the second protruding part 312 may be fixed to the substrate 600 through soldering.

One side of the (3-1)th terminal 330 is connected to the substrate 600, and the other side thereof is connected to the DM filter 370. Thus, the (3-1)th terminal 330 electrically connects the DM filter 370 to the substrate 600. Here, one region of the (3-1)th terminal 330 may pass through the controller cover 400. To this end, a hole may be formed in the controller cover 400.

The (3-1)th terminal 330 may include a (3-1)th body 331 disposed horizontally, a (3-1)th frame 332 protruding downward from an end portion of one side of the (3-1)th body 331, and a (3-1)th end portion 333 disposed at the other side of the (3-1)th body 331.

One region of the (3-1)th body 331 may be bent toward the substrate 600. For example, the (3-1)th frame 332, which is a bent end portion of one side of the (3-1)th terminal 330, may be formed by bending one side of the (3-1)th body 331 downward.

The (3-1)th frame 332, which is an end portion of the (3-1)th terminal 330, may be disposed to protrude from an end portion of the second protruding part 312. Here, the second protruding part 312 is disposed to surround one region of the (3-1)th frame 332 so that the (3-1)th terminal 330 is insulated from the controller cover 400.

In addition, an end portion of the (3-1)th frame 332 exposed from the second protruding part 312 may be fixed to the substrate 600 through soldering.

The (3-1)th end portion 333, which is an end portion of the other side of the (3-1)th terminal 330, is electrically connected to a third wire 371 disposed in the DM filter 370. To this end, the (3-1)th end portion 333 may be formed in a shape in which two protrusions are disposed to be spaced apart from each other, and as illustrated in FIG. 13, the third wire 371 may be disposed between the protrusions. Here, the third wire 371 may be electrically connected to the (3-1)th end portion 333 of the (3-1)th terminal 330 through a fusing process.

The (3-2)th terminal 340 allows the DM filter 370, the second capacitor 380, the power module unit 500, and the substrate 600 to be electrically connected to each other.

The (3-2)th terminal 340 may include a (3-2)th body 341 disposed horizontally, a (3-2)th frame 342 protruding downward from the (3-2)th body 341, and a (3-2)th end portion 343 protruding upward from the (3-2)th body 341. Here, the (3-2)th frame 342 may include a (3-2-1)th frame 342a having an end portion coupled to the power module unit 500, and a (3-2-2)th frame 342b having an end portion coupled to the substrate 600. In addition, the (3-2)th end portion 343 may include a (3-2-1)th end portion 343a coupled to the DM filter 370 and a (3-2-2)th end portion 343b coupled to the second capacitor 380.

One region of the (3-2)th body 341 may be bent downward. For example, the (3-2)th frame 342, which is a bent end portion of one side of the (3-2)th terminal 340, may be formed by bending one side of the (3-2)th body 341 downward.

Accordingly, the end portion of the (3-2-1)th frame 342a that is one portion of the (3-2)th frame 342 may be coupled to the power module unit 500. In addition, the end portion of the (3-2-2)th frame 342b which is another portion of the (3-2)th frame 342 may be coupled to the substrate 600. Here, a length of the (3-2-1)th frame 342a is less than a length of the (3-2-2)th frame 342b.

The (3-2)th frame 342 of the (3-2)th terminal 340 may pass through the controller cover 400. To this end, a hole may be formed in the controller cover 400.

Meanwhile, the (3-2)th frame 342 of the (3-2)th terminal 340 may be disposed to protrude from an end portion of the second protruding part 312. Here, the second protruding part 312 is disposed to surround one region of the (3-2)th frame 342 so that the (3-2)th terminal 340 that is disposed to pass through the controller cover 400 is insulated from the controller cover 400.

In addition, an end portion of the (3-2-2)th frame 342b exposed from the second protruding part 312 may be fixed to the substrate 600 through soldering.

The (3-2-1)th end portion 343a, which is one of end portions of the other side of the (3-2)th terminal 340, is electrically connected to the third wire 371 disposed in the DM filter 370. To this end, the (3-2-1)th end portion 343a may be formed in a shape in which two protrusions are disposed to be spaced apart from each other, and as illustrated in FIG. 13, the third wire 371 may be disposed between the protrusions. Here, the third wire 371 may be electrically connected to the (3-2-1)th end portion 343a of the (3-1)th terminal 330 through a fusing process. Here, the third wire 371 may be referred to as a first DM filter wire.

The (3-2-2)th end portion 343b, which is another one of the end portions of the other side of the (3-2)th terminal 340, is electrically connected to a fourth wire 381 disposed in the second capacitor 380. For example, the (3-2-2)th end portion 343b may be formed in a shape in which two protrusions are disposed to be spaced apart from each other, and as illustrated in FIG. 13, the fourth wire 381 may be disposed between the protrusions. Here, the fourth wire 381 may be electrically connected to the (3-2-2)th end portion 343b of the (3-1)th terminal 330 through a fusing process. Here, the fourth wire 381 may be referred to as a second DM filter wire.

The (3-3)th terminal 350 allows the second capacitor 380, the power module unit 500, and the substrate 600 to be electrically connected to each other.

The (3-3)th terminal 350 may include a (3-3)th body 351 disposed horizontally, a (3-3)th frame 352 protruding downward from the (3-3)th body 351, and a (3-3)th end portion 353 protruding upward from the (3-3)th body 351.

One region of the (3-3)th body 351 may be bent downward. For example, the (3-3)th frame 352, which is a bent end portion of one side of the (3-3)th terminal 350, may be formed by bending one side of the (3-3)th body 351 downward.

Here, the (3-3)th frame 352 may include a (3-3-1)th frame 352*a* having an end portion coupled to the substrate 600 to receive power, a (3-3-2)th frame 352*b* having an end portion coupled to the substrate 600 to transmit the power, and a (3-3-3)th frame 352*c* having an end portion coupled to the power module unit 500 to transmit the power.

Here, a length of the (3-3-3)th frame 352*c* is less than a length of the (3-3-1)th frame 352*a*. In addition, the length of the (3-3-1)th frame 352*a* may be the same as a length of the (3-3-2)th frame 352*b*.

Further, the (3-3)th frame 352 of the (3-3)th terminal 350 may pass through the controller cover 400. To this end, a hole may be formed in the controller cover 400.

Further, the (3-3)th frame 352 of the (3-3)th terminal 350 may be disposed to protrude from an end portion of the second protruding part 312. Here, the second protruding part 312 is disposed to surround one region of the (3-3)th frame 352 so that the (3-3)th terminal 350 that is disposed to pass through the controller cover 400 is insulated from the controller cover 400.

In addition, an end portion of the (3-3)th frame 352 exposed from the second protruding part 312 may be fixed to the substrate 600 through soldering.

The (3-3)th end portion 353, which is an end portion of the other side of the (3-3)th terminal 350, is electrically connected to the fourth wire 381 disposed in the second capacitor 380. For example, the (3-3)th end portion 353 may be formed in a shape in which two protrusions are disposed to be spaced apart from each other, and as illustrated in FIG. 13, the fourth wire 381 may be disposed between the protrusions. Here, the fourth wire 381 may be electrically connected to the (3-3)th end portion 353 of the (3-1)th terminal 330 through a fusing process.

The (3-4)th terminal 360 may be electrically connected to the (2-2)th terminal 240 and the controller cover 400.

One region of the (3-3)th terminal 350 may be cut to form the (3-4)th terminal 360. For example, the (3-4)th terminal 360 may be formed by pressing and cutting one region of the (3-3)th terminal 350 when the (3-3)th terminal 350 is disposed in the DM filter unit body 310 through the insert injection method.

The (3-4)th terminal 360 may include a (3-4)th body 361 disposed horizontally, a (3-4)th frame 362 protruding downward from the (3-4)th body 361, and a (3-4)th end portion 363 protruding horizontally from the (3-4)th body 361.

One region of the (3-4)th body 361 may be bent downward. For example, the (3-4)th frame 362, which is a bent end portion of one side of the (3-4)th terminal 360, may be formed by bending one side of the (3-4)th body 361 downward. In addition, an end portion of the (3-4)th frame 362 may be brought into contact with the controller cover 400 by horizontally bending the end portion of the (3-4)th frame 362. Accordingly, the (3-4)th frame 362 may perform grounding.

The (3-4)th end portion 363 may be provided as one protrusion, as illustrated in FIG. 18. Accordingly, as illustrated in FIG. 19, the (3-4)th end portion 363 may be coupled to the (2-2)th protrusion 243 of the (2-2)th frame 242.

The DM filter 370 may be disposed between the (3-1)th terminal 330 and the (3-2)th terminal 340.

The DM filter 370 may reduce a DM noise. For example, the (3-1)th terminal 330 and the (3-2)th terminal 340 may be used as power lines, and the DM filter 370 may reduce the CM noise, which is caused by a DM current component, among conductive noises generated through the (3-1)th terminal 330 and the (3-2)th terminal 340 being used as the power lines.

A plurality of third wires 371 may be arranged in the DM filter 370, and the third wires 371 may be electrically connected to each of the (3-1)th terminal 330 and the (3-2)th terminal 340.

The second capacitor 380 may be disposed above the DM filter unit body 310.

Here, a plurality of fourth wires 381 arranged in the second capacitor 380 may be electrically connected to each of the (3-2)th terminal 340 and the (3-3)th terminal 350.

FIG. 20 is a perspective view illustrating the controller cover of the motor assembly according to the embodiment, FIG. 21 is a bottom perspective view illustrating the controller cover of the motor assembly according to the embodiment, FIG. 22 is a bottom view illustrating the controller cover of the motor assembly according to the embodiment, and FIG. 23 is an enlarged view of region A in FIG. 3.

The controller cover 400 may be disposed on the opening of the controller housing 100. The controller cover 400 may be disposed between the DM filter unit 300 and the substrate 600.

Referring to FIGS. 20 to 22, the controller cover 400 may include a controller cover body 410 disposed on the opening of the controller housing 100 and a third protruding part 420 protruding downward from the controller cover body 410. In addition, the controller cover 400 may further include a sealing member 430 and an O-ring 440. Here, the controller cover body 410 may be referred to as a fourth body.

The controller cover body 410 and the third protruding part 420 may be integrally formed. Accordingly, the controller cover 400 may be made of a metal material. For example, the controller cover 400 may be made of an aluminum material having good thermal conductivity through a die-casting method.

The controller cover body 410 may be formed in a plate shape.

The end portion of the (3-4)th frame 362 may be in contact with an upper surface 411 of the controller cover body 410. Accordingly, the controller cover body 410 made of a metal material may perform grounding. Here, the third protruding part 420 may be in contact with a motor housing 10 of the motor 3.

A first groove 412 may be formed along an edge of the upper surface 411 of the controller cover body 410. Here, the first groove 412 may be formed in a shape corresponding to the shape of the first protruding part 115 of the controller housing 100. Accordingly, the first protruding part 115 may be coupled to the first groove 412. Here, the first groove 412 may be referred to as a coupling groove.

Referring to FIG. 23, two first grooves 412 may be formed. Accordingly, the coupling force and airtightness of the controller housing 100 and the controller cover 400 may be improved.

The sealing member 430 may be further disposed in the first groove 412. As illustrated in FIG. 23, the sealing member 430 is disposed between the first protruding part 115 and the first groove 412 to further improve the airtightness.

In addition, a plurality of fifth holes 413 are formed in the controller cover body 410. The fifth holes 413 may be formed to vertically pass through the controller cover body 410. Thus, the frames of the first connector 700, the second connector 800, and the third terminal 320 and the like may pass through the controller cover body 410 through the fifth holes 413. Here, the fifth hole 413 may be referred to as a through hole.

A second groove 415 may be formed in a lower surface 414 of the controller cover body 410. Here, the second groove 415 may be referred to as a placement groove.

Further, a protrusion protruding downward may be further disposed on the lower surface of the controller cover body 410. In addition, the protrusion may be integrally formed with the controller cover body 410. In addition, the protrusion may guide the placement of the power module unit 500.

The third protruding part 420 may be formed to protrude downward from the controller cover body 410. In addition, the third protruding part 420 may be formed in a cylindrical shape.

The third protruding part 420 may be disposed inside the motor housing 10 of the motor 3. Here, an outer circumferential surface of the third protruding part 420 is in contact with an inner circumferential surface of the motor housing 10 to perform grounding. Here, the motor housing 10 may be referred to as a second housing.

A third groove 421 may be formed along the outer circumferential surface of the third protruding part 420. The O-ring 440 may be disposed in the third groove 421. Here, the third groove 421 may be referred to as an O-ring groove.

As illustrated in FIG. 23, the O-ring 440 may improve airtightness between the inner circumferential surface of the motor housing 10 and the third protruding part 420.

FIG. 24 is a perspective view illustrating the power module unit according to the first embodiment of the motor assembly according to the embodiment, FIG. 25 is a bottom perspective view illustrating the power module unit according to the first embodiment of the motor assembly according to the embodiment, FIG. 26 is an exploded perspective view illustrating the power module unit according to the first embodiment of the motor assembly according to the embodiment, FIG. 27 is a plan view illustrating the power module unit according to the first embodiment of the motor assembly according to the embodiment, FIG. 28 is a side view illustrating the power module unit according to the first embodiment of the motor assembly according to the embodiment, FIG. 29 is a view illustrating the power module of the power module unit according to the first embodiment, and FIG. 30 is a view illustrating a bracket of the power module unit according to the first embodiment.

The power module unit 500 according to the first embodiment may transmit a signal capable of controlling the motor 3. The power module unit 500 may be disposed between the controller cover 400 and the substrate 600.

Referring to FIGS. 24 to 27, the power module unit 500 may include a power module 510 and a bracket 520.

The power module 510 transmits a signal capable of controlling the motor 3. Here, an automotive power module (APM) may be used as the power module 510. Accordingly, the power module 510 generates a great amount of heat than other components of the controller 2.

The power module 510 may include a power module body 511, a plurality of first pins 512 protruding downward from one side of the power module body 511, and five terminal pins 513 disposed to protrude downward from the other side of the power module body 511. The power module 510 may further include a fourth groove 514. Here, the power module body 511 may be referred to as a fifth body.

As illustrated in FIG. 28, the first pin 512 and the terminal pin 513 may be spaced apart to face each other. In addition, an end portion of the first pin 512 is coupled to the substrate 600 to receive a signal from the substrate 600. Here, the first pin 512 may be fixed to the substrate 600 through soldering. Here, the first pin 512 may be referred to as a power module pin. In addition, the terminal pin 513 may be referred to as a power module terminal.

Referring to FIG. 25, the terminal pin 513 may include a first terminal pin 513a and a second terminal pin 513b.

Three first terminal pins 513a may be electrically connected to fourth terminals 522 of the bracket 520. Accordingly, the power may be supplied to the motor 3 through the fourth terminal 522. Here, the fourth terminal 522 may be referred to as a controller terminal.

Each of two second terminal pins 513b is electrically connected to each of the (3-2-1)th frame 342a of the (3-2)th terminal 340 and the (3-3-3)th frame 352c of the (3-3)th terminal 350 to receive the power.

When the power module 510 is disposed on the bracket 520, the fourth groove 514, which is concavely formed, guides the assembly of the power module 510. Here, the fourth groove 514 may be referred to as a guide groove.

As illustrated in FIG. 27, two fourth grooves 514 may be formed at both sides of the power module body 511. In addition, the fourth grooves 514 may be disposed on a virtual line L passing through the power module body 511.

Meanwhile, the power module 510 may further include a third protrusion 515. Here, the third protrusion 515 may be referred to as a coupling protrusion.

Referring to FIG. 29, the third protrusion 515 may be formed to protrude downward from an end portion of the first terminal pin 513a. For example, the third protrusion 515 may protrude in the same direction as a direction in which the first terminal pin 513a protrudes. Here, an end portion of the third protrusion 515 may be coupled to the substrate 600.

The end portion of the third protrusion 515 may be fixed to the substrate 600 through soldering. Accordingly, a sensor disposed on the substrate 600 may confirm whether a signal is transmitted to the motor 3 through the third protrusion 515. In addition, the substrate 600 may shut off the motor 3 by confirming the signal transmitted to the motor 3.

As illustrated in FIG. 29, a width W1 of the third protrusion 515 is less than a width W2 of the first terminal pin 513a. Accordingly, the third protrusion 515 may be easily disposed on and fixed to the substrate 600. Here, the width W1 of the third protrusion 515 determines the occupied space and soldering amount of the substrate 600.

The bracket 520 presses the power module 510 against the lower surface 414 of the controller cover 400. Here, the coupling member 4 such as a bolt may be used. Accordingly, heat generated in the power module 510 is conducted to the controller cover 400, and the conducted heat is discharged to the outside through the motor housing 10 of the motor 3. That is, the heat dissipation effect of the controller 2 may be increased due to the controller cover 400 made of a metal material.

The bracket 520 may include a bracket body 521 and the fourth terminal 522. Here, the bracket body 521 may be made of a synthetic resin material, and the fourth terminal 522 may be made of a metal material. Accordingly, the fourth terminal 522 may be disposed on the bracket body 521 through an insert injection method. Here, the bracket body 521 may be referred to as a sixth body.

The bracket body 521 may include a cavity 523 formed in the bracket body 521, a fourth boss 524, a plate 525, hooks 526 disposed on the bracket body 521 to be spaced apart from each other, a fourth protrusion 527, and a fourth protruding part 528. Here, the fourth boss 524, the plate 525, the hook 526, the fourth protrusion 527, and the fourth protruding part 528 may be integrally formed with the bracket body 521. Here, the fourth boss 524 may be referred to as a bracket boss or boss part. In addition, the plate 525 may be referred to as a support part.

As illustrated in FIG. 26, the power module body 511 of the power module 510 may be disposed in the cavity 523.

Three fourth bosses 524 may be formed to protrude downward from the bracket body 521. Each of the fourth bosses 524 may have a space formed therein, and one side of the fourth terminal 522 may be disposed in the fourth boss 524.

In addition, each of the fourth bosses 524 guides the motor 3 to couple to one region of a bus-bar terminal 62. Accordingly, one region of the bus-bar terminal 62 may be coupled to one side of the fourth terminal 522 to receive one power of three-phase (U, V, and W) powers.

The plate 525 may be disposed below the bracket body 521 to cross the cavity 523, as illustrated in FIG. 25. Here, the plate 525 may be formed in a plate shape. Accordingly, the plate 525 is in contact with a lower surface 511a of the power module body 511 so that the power module 510 is pressed against the controller cover 400.

The hooks 526 may be disposed on the bracket body 521 to be spaced apart from each other. Here, the hook 526 may be formed to protrude upward from the bracket body 521.

When the power module 510 is disposed in the cavity 523, the hook 526 fixes the power module body 511 to the bracket body 521. Here, since the second groove 415 may be formed in the lower surface 414 of the controller cover body 410, an end portion of the hook 526 may be disposed in the second groove 415 of the controller cover 400. Accordingly, when the controller cover 400 is coupled to the power module unit 500, interference due to the hook 526 is prevented.

As illustrated in FIG. 27, the hook 526 may be disposed to be spaced apart from the virtual line L passing through a center of the power module body 511 at a predetermined distance d. Accordingly, when the controller cover 400 is coupled to the power module unit 500, the power module unit 500 may be assembled at a preset position by the coupling of the second groove 415 and the hook 526.

As illustrated in FIG. 30, the fourth protrusion 527 may be formed to protrude toward an inner side of the cavity 523. In addition, the fourth protrusion 527 is coupled to the fourth groove 514 of the power module 510. Accordingly, when the power module 510 is coupled to the bracket 520, the fourth protrusion 527 is disposed in the fourth groove 514 so that the fourth protrusion 527 guides the coupling of the power module 510. Here, the fourth protrusion 527 may be referred to as a guide protrusion.

The fourth protruding part 528 may be formed to protrude downward from the bracket body 521. Here, the fourth protruding part 528 may be disposed adjacent to the first pins 512. Here, the term "adjacent to" refers to being in contact with or disposed to be spaced apart at predetermined intervals. Here, the fourth protruding part 528 may be referred to as a protection part.

Thus, the fourth protruding part 528 may protect the first pin 512. For example, when the first pin 512 is coupled to the substrate 600, the fourth protruding part 528 supports one region of the first pin 512 to prevent or minimize the phenomenon in which the first pin 512 is bent.

As illustrated in FIG. 30, the fourth protruding part 528 may include a (4-1)th protruding part 528a and a plurality of (4-2)th protruding parts 528b.

The (4-1)th protruding part 528a may be formed in a plate shape. And, the (4-2)th protruding parts 528b may protrude toward the first pin 512 from one surface of the (4-1)th protruding part 528a. Accordingly, the first pin 512 may be disposed between the (4-2)th protruding parts 528b.

As illustrated in FIG. 28, in order for the end portion of the first pin 512 and the substrate 600 to be coupled to each other, a protruding height H1 of the fourth protruding part 528 is less than a protruding height H2 of the first pin 512 on the basis of the lower surface 414 of the controller cover 400. That is, the protruding height H2 of the first pin 512 is greater than the protruding height H1 of the fourth protruding part 528. Here, the protruding height may be referred to as a protruding length.

The fourth terminal 522 electrically connects the first terminal pin 513a to the bus-bar terminal 62 of the motor 3.

Referring to FIGS. 25 and 27, an end portion of one side of the fourth terminal 522 is bent downward and exposed, and an end portion of the other side thereof may be disposed inside the fourth boss 524.

FIG. 31 is a view illustrating the fourth terminal of the power module unit according to the first embodiment.

Referring to FIG. 31, the fourth terminal 522 may include a fourth body 522a disposed horizontally, a fourth frame 522b formed to protrude downward from an end portion of one side of the fourth body 522a, and a fourth end portion 522c bent downward from an end portion of the other side of the fourth body 522a and then bent in the horizontal direction. Here, a sixth hole 522d may be formed in the fourth end portion 522c. Here, the fourth end portion 522c is disposed to be exposed inside the fourth boss 524. Here, the sixth hole 522d may be referred to as an insertion hole or hole.

The fourth frame 522b may be disposed to be in contact with the first terminal pin 513a. Here, the contact force between the fourth frame 522b and the first terminal pin 513a may be improved through a fusing process.

An end portion of the bus-bar terminal 62 may be coupled to the sixth hole 522d. Here, two sixth holes 522d may be formed to improve the coupling force and contact force with the end portion of the bus-bar terminal 62.

A heat transfer member (not shown) may be further disposed between the controller cover 400 and the power module 510 of the power module unit 500. Accordingly, heat generated by the power module 510 is conducted to the controller cover 400 through the heat transfer member. Here, a thermal pad, a thermal grease, or the like may be used as the heat transfer member.

FIG. 32 is a view illustrating the substrate of the motor assembly according to the embodiment.

The substrate 600 may prevent the reverse connection of the power. Here, the term "reverse connection" means that a positive polarity and a negative polarity of power sources are applied differently from the preset polarities, and thus damage to the motor assembly 1 may occur due to the reverse connection. Thus, even when the positive and negative polarities of the power sources are applied differently from the preset polarities, the substrate 600 may prevent damage due to the reverse connection by using a metal-oxide-semiconductor field-effect transistor (MOSFET).

That is, the controller 2 receives power from the external connector coupled to the first boss 111, removes noises using the CM filter unit 200 and the DM filter unit 300, and then transmits the power to the substrate 600. In addition, the power in which the reverse connection is prevented at the substrate 600 is transferred to the DM filter unit 300 and then supplied to the power module unit 500 and the substrate 600.

In addition, the substrate 600 may transmit and receive signals to and from the external connector through the first connector 700 and the second connector 800. In addition, the substrate 600 may transmit and receive signals to and from the power module unit 500.

Referring to FIG. 32, the substrate 600 may include a substrate body 610 on which circuit wiring is disposed, a plurality of seventh holes 620, a MOSFET 630, and a sensor 640. Here, the substrate body 610 may be referred to as a seventh body. In addition, the seventh holes 620 may be referred to as through holes.

The plurality of seventh holes 620 may be formed in the substrate body 610. In addition, the end portion of the third frame 322, the end portion of the (3-1)th frame 332, the end portion of the (3-2-2)th frame 342b, the end portion of the (3-3)th frame 352, the end portion of the first pin 512, the end portion of the third protrusion 515, and the like may be disposed in the seventh holes 620. Further, each of the end portions may be soldered to be fixed to the substrate body 610.

The MOSFET 630 may be disposed on the substrate body 610.

The MOSFET 630 prevents the reverse connection of the power supplied to the substrate body 610 after the noises are removed by the CM filter unit 200 and the DM filter unit 300.

The sensor 640 may be disposed on the substrate body 610.

The sensor 640 senses whether a signal is properly transmitted to the motor 3 through the third protrusion 515.

FIG. 33 is a view illustrating the first connector of the motor assembly according to the embodiment.

The first connector 700 electrically connects the external connector coupled to the second boss 112 to the substrate 600. Here, one side of the first connector 700 is coupled to the substrate 600.

Referring to FIG. 33, the first connector 700 may include a first connector body 710 and a plurality of first connector pins 720. Here, the first connector body 710 may be made of a synthetic resin material, and the first connector pin 720 may be made of a metal material. In addition, the first connector body 710 may be referred to as an eighth body. Also, the first connector pin 720 may be referred to as a second pin.

One side of the first connector pin 720 is connected to the external connector coupled to the second boss 112, and the other side of the first connector pin 720 is electrically connected to the substrate 600.

FIG. 34 is a view illustrating the second connector of the motor assembly according to the embodiment.

The second connector 800 electrically connects the external connector coupled to the third boss 113 to the substrate 600. Here, one side of the second connector 800 is coupled to the substrate 600.

Referring to FIG. 34, the second connector 800 may include a second connector body 810 and a plurality of second connector pins 820. Here, the second connector body 810 may be made of a synthetic resin material, and the second connector pin 820 may be made of a metal material. In addition, the second connector body 810 may be referred to as a ninth body. Further, the second connector pin 820 may be referred to as a third pin.

One side of the second connector pin 820 is connected to the external connector coupled to the third boss 113, and the other side of the second connector pin 820 is electrically connected to the substrate 600.

Referring to FIGS. 1 to 3, the motor 3 according to the embodiment may include the motor housing 10 having an opening formed at one side thereof, a motor cover 20 covering the opening of the motor housing 10, a stator 30 disposed inside the housing 10, a rotor 40 rotatably disposed in the stator 30, a rotation shaft 50 rotating together with the rotor 40, and a bus bar 60. Here, a bearing 70 may be disposed on an outer circumferential surface of the rotation shaft 50 for the rotation of the rotation shaft 50. Here, the motor cover 20 may be referred to as a second cover part.

Here, the motor housing 10 and the motor cover 20 may form an outer shape of the motor 3. In addition, an accommodation space may be formed by coupling the motor housing 10 to the motor cover 20. Accordingly, as illustrated in FIG. 3, the stator 30, the rotor 40, the rotation shaft 50, and the bus bar 60 may be disposed in the accommodation space.

The motor housing 10 may be formed in a cylindrical shape such that the accommodation space is formed. The inner circumferential surface of the motor housing 10 may be coupled to the outer circumferential surface of the third protruding part 420

Here, the motor housing 10 may be made of a metal material. Accordingly, heat transmitted through the controller cover 400 is emitted to the outside through the motor housing 10. In addition, the motor housing 10 is in contact with the controller cover 400 and thus a grounding function may be performed.

The motor cover 20 is disposed in the opening of an upper side of the motor housing 10. Here, the bearing 70 may be disposed inside the motor cover 20.

The stator 30 may be disposed inside the motor housing 10. In addition, the stator 30 causes electrical interaction with the rotor 40.

Referring to FIG. 3, the stator 30 may include a stator core 31 and a coil 33 wound around the stator core 31. In addition, the stator 30 may further include an insulator 32 disposed between the stator core 31 and the coil 33. The insulator 32 insulates the stator core 31 from the coil 33.

The stator core 31 may be formed by stacking plates having a plate shape at a predetermined height.

The rotor 40 may be disposed inside the stator 30 and may be disposed on the outer circumferential surface of the rotation shaft 50. Here, the rotor 40 may be rotatably disposed in the stator 30.

The rotor 40 may be formed by stacking a plurality of disk-shaped core plates. Magnets disposed on the rotor 40 are disposed to face the stator 30, and each of the magnets may be formed as an interior permanent magnet (IPM) type that is inserted into and coupled to the rotor 40 through a hole formed in the rotor 40.

The rotor 40 may be configured as a type in which a magnet is disposed on an outer circumferential surface of a rotor core.

Accordingly, the rotor 40 is rotated by the electric interaction between the coil 33 and the magnet. In addition, the rotation shaft 50 rotates as the rotor 40 rotates to generate a driving force.

The rotation shaft 50 may be disposed to pass through a central portion of the rotor 40. When a driving current is applied to the stator 30, the rotor 40 is rotated by the electromagnetic interaction between the stator 30 and the rotor 40 so that the rotation shaft 50 rotates in conjunction with the rotation of the rotor 40.

The bus bar 60 is disposed above the stator 30.

The bus bar 60 may include a bus-bar body 61 and the bus-bar terminal 62 disposed inside the bus-bar body 61.

Here, the bus-bar body 61 may be a molded product formed through injection molding.

The bus-bar terminal 62 may be a phase terminal connected to power sources of a U-phase, a V-phase, or a W-phase.

Connecting end portions of the bus-bar terminal 62 are disposed to be exposed from the bus-bar body 61. Accordingly, the connecting end portion of the bus-bar terminal 62 may be connected to the coil 33 as illustrated in FIG. 3.

FIG. 35 is a view illustrating the bus-bar terminal of the motor assembly according to the embodiment.

Referring to FIG. 35, the bus-bar terminal 62 may include a bus-bar terminal body 62a and a fifth frame 62b protruding upward from the bus-bar terminal body 62a. Here, the fifth frame 62b may be referred to as a coupling end portion.

The fifth frame 62b may be disposed to protrude toward an upper side of the motor cover 20 through the motor cover 20.

An end portion of the fifth frame 62b is guided by the fourth boss 524 and coupled to one side of the fourth terminal 522 disposed inside the fourth boss 524. Here, two protrusions may be formed to be spaced apart from each other at the end portion of the fifth frame 62b, and the protrusions may be coupled to the sixth holes 522d of the fourth terminal 522.

Meanwhile, a power module unit 500a according to a second embodiment may be disposed in the motor assembly 1 according to the embodiment instead of the power module unit 500 according to the first embodiment.

FIG. 36 is an exploded perspective view illustrating the motor according to the embodiment in which the power module unit 500a according to the second embodiment is disposed.

Referring to FIGS. 1 and 36, the motor assembly 1 according to the embodiment may include the controller 2 and the motor 3. In addition, the controller 2 may include the controller housing 100, the CM filter unit 200, the DM filter unit 300, the controller cover 400, the power module unit 500a according to the second embodiment, the substrate 600, the first connector 700, and the second connector 800.

Hereinafter, in describing the motor assembly 1 according to the embodiment in which the power module unit 500a according to the second embodiment is disposed, the same components described in the motor assembly 1, in which the power module unit 500 according to the first embodiment is disposed, are described with the same reference numerals, and thus detailed descriptions of the controller housing 100, the CM filter unit 200, the DM filter unit 300, the controller cover 400, the substrate 600, the first connector 700, and the second connector 800 will be omitted.

Power in which the reverse connection is prevented at the substrate 600 is transferred to the DM filter unit 300 and then supplied to the power module unit 500a.

In addition, the power module unit 500a transmits a signal capable of controlling the motor 3. Here, the power module unit 500a is pressed against the lower surface 414 of the controller cover 400.

FIG. 37 is a perspective view illustrating the power module unit according to the second embodiment of the motor assembly according to the embodiment, FIG. 38 is a bottom perspective view illustrating the power module unit according to the second embodiment of the motor assembly according to the embodiment, and FIG. 39 is a plan view illustrating the power module unit according to the second embodiment of the motor assembly according to the embodiment.

Referring to FIGS. 37 to 39, the power module unit 500a may include a power module 510a and a mold unit 530 surrounding the power module 510a. At this point, the power module 510a may be disposed in the mold unit 530 through an injection method. Here, the mold unit 530 may be made of a synthetic resin material. Since the power module unit 500a is formed through the injection method, material costs and mold costs may be reduced and thus production costs may be reduced.

The power module 510a transmits a signal capable of controlling the motor 3. Here, an APM may be used as the power module 510a.

FIG. 40 is a view illustrating the power module of the power module unit according to the second embodiment.

Referring to FIG. 40, the power module 510a may include a power module body 511a, a plurality of power module pins 512 arranged to protrude downward from one side of the power module body 511, and a terminal part.

The terminal part may include two first power module terminals 513b each having one region arranged to protrude downward from the other side of the power module body 511a and three second power module terminals 516 each having one side connected to the power module body 511a.

Here, the power module pin 512 is the same component as the first pin 512 of the power module unit 500 according to the first embodiment.

In addition, the first power module terminal 513b is the same component as the second terminal pin 513b of the power module unit 500 according to the first embodiment. In addition, the second power module terminal 516 is a component obtained by modifying the first terminal pin 513a and the fourth terminal 522 of the power module unit 500 according to the first embodiment to be integrated.

One side of the power module body 511a is disposed to be pressed against the lower surface 414 of the controller cover 400. As illustrated in FIG. 37, the power module body 511a may be formed to have a concave-convex shape in which a partial region thereof protrudes. That is, the power module body 511a may include the power module body 511 according to the first embodiment and a protruding region A protruding from one side of the power module body 511 according to the first embodiment.

Accordingly, when compared to the power module body 511 of the power module unit 500 according to the first embodiment, the power module body 511a has an increased contact area that is in contact with the controller cover 400 due to the protruding region A so that heat dissipation performance may be improved. In addition, since the size of the power module body 511a may be increased, a degree of design freedom may be increased.

The power module pin 512 and the first power module terminal 513b may be disposed to be spaced apart from each other to face each other. In addition, an end portion of the power module pin 512 is coupled to the substrate 600 to receive a signal from the substrate 600. Here, the power module pin 512 may be fixed to the substrate 600 through soldering.

One side of the first power module terminal 513b is electrically connected to the power module body 511a, and the other side thereof may be bent downward.

As illustrated in FIG. 38, one side of the first power module terminal 513b may be connected to the protruding region A of the power module body 511a, and the other side of the first power module terminal 513b may protrude toward the outside of the mold unit 530. Here, the power module pin 512 and one region of the first power module terminal 513b protruding downward may be disposed to be spaced apart from each other to face each other.

Each of two first power module terminals 513b is electrically connected to each of the (3-2-1)th frame 342a of the (3-2)th terminal 340 and the (3-3-3)th frame 352c of the (3-3)th terminal 350 to receive the power. Here, the first power module terminals 513b may be disposed with the protruding region A of the power module body 511 interposed therebetween.

Power is supplied to the motor 3 through the second power module terminal 516. Here, the second power module terminal 516 may be made of a metal material.

An end portion of one side of the second power module terminal 516 may be connected to one side of the power module body 511a, and an end portion of the other side of the second power module terminal 516 may be disposed in a boss part 531. As illustrated in FIG. 40, the end portion of one side of the second power module terminal 516 may be disposed in the protruding region A of the power module body 511a.

Referring to FIG. 40, the second power module terminal 516 may include a fourth body 516a that is horizontally disposed and has one side end portion connected to the protruding region A of the power module body 511a, and a fourth end portion 516c that is bent downward from the other side end portion of the fourth body 516a and then bent in a horizontal direction. Here, a sixth hole 516d may be formed at the fourth end portion 516c. Here, the fourth end portion 516c having the sixth hole 516d formed therein is disposed to be exposed inside the boss part 531. Here, the fourth body 516a may be referred to as a power module terminal body. In addition, the sixth hole 516d may be referred to as an insertion hole or hole.

The end portion of the bus-bar terminal 62 may be coupled to the sixth hole 516d. Here, two sixth holes 516d may be formed to enhance the coupling force and contact force with the end portion of the bus-bar terminal 62.

The mold unit 530 may be disposed to surround one region of the power module 510a. Here, the mold unit 530 may be divided into a first region surrounding the power module body 511 and a second region surrounding the protruding region A.

The boss part 531 and a groove 532 may be formed in the mold unit 530. Here, the boss part 531 may be disposed in the second region. In addition, the groove 532 may be disposed in the first region.

Referring to FIG. 39, a width W3 of one side of the mold unit 530 on which the boss part 531 is formed is less than a width W4 of the other side of the mold unit 530 disposed to face the one side. For example, the width W3 of the second region is less than the width W4 of the first region. Here, width W3:width W4 is 16:37.

Each of three boss parts 531 may be formed to protrude downward from one side of the mold unit 530. At this point, the boss part 531 protrudes toward the substrate 600 and is branched into three parts from the mold unit 530, as illustrated in FIG. 38. Here, the boss part 531 may be disposed in the second region to be adjacent to the protruding region A.

A space may be formed in each of the boss parts 531, and the fourth end portion 516c of the second power module terminal 516 may be disposed in the boss part 531. Here, the space may be formed to pass through from a lower portion to an upper portion of the boss part 531.

In addition, each of the boss parts 531 guides the motor 3 to couple to one region of the bus-bar terminal 62. Accordingly, one region of the bus-bar terminal 62 may be coupled to the fourth end portion 516c of the second power module terminal 516 to receive one power of three-phase (U, V, and W) powers.

Meanwhile, a protruding part 531a may be further formed at a lower end of each of the boss parts 531.

The protruding part 531a is formed to protrude downward from the lower end of the boss part 531. Accordingly, the space of the boss part 531 extends downward due to the protruding part 531a. As illustrated in FIG. 38, the protruding part 531a may be formed in a quadrangular shape in a plan view.

Two grooves 532 may be formed at both sides of the power module body 511. In addition, the power module unit 500a is in close contact with and fixed to the lower surface 414 of the controller cover 400 by a fastening member (not shown) such as a bolt or screw passing through the groove 532.

Although the above-described descriptions are described with reference to the embodiments of the present invention, it should be understood that those skilled in the art may be capable of variously modifying and changing the present invention within the spirit and the scope disclosed in the claims which will be described below. In addition, it should be interpreted that the differences related to the change and modification fall within the range of the present invention defined by the appended claims.

EXPLANATION OF REFERENCE NUMERALS

1: motor assembly, 10: motor housing, 20: motor cover, 60: bus bar, 100: controller housing, 200: common-mode (CM) filter unit, 300: differential-mode (DM) filter unit, 400: controller cover, 500 or 500a: power module unit, 600: substrate, 630: metal-oxide-semiconductor field-effect transistor (MOSFET), 700: first connector, 800: second connector.

The invention claimed is:
1. A controller comprising:
a first housing;
a first cover disposed on an opening of the first housing;
filter units disposed above the first cover;
a power module unit disposed below the first cover; and
a substrate disposed below the power module unit,
wherein the power module unit includes:
a bracket; and
a power module disposed between the bracket and the first cover,
wherein the power module includes:
a power module body;
a plurality of first pins arranged to protrude downward from one side of the power module body; and
five terminal pins arranged to protrude downward from the other side of the power module body, and
wherein an end portion of the first pin is coupled to the substrate.

2. The controller of claim 1, wherein a protrusion protrudes from an end portion of each of three terminal pins among the terminal pins, and
wherein an end portion of the protrusion is coupled to the substrate.

3. The controller of claim 2, wherein one surface of the power module is pressed against the first cover, which is made of a metal material, by the bracket.

4. The controller of claim 2, wherein the bracket includes:
a bracket body having a structure of a cavity in which the power module is disposed and three bosses protrude downward; and
a terminal having one side disposed to be exposed inside each of the bosses and the other side disposed on the bracket body to protrude downward.

5. The controller of claim 4, wherein the terminal is in contact with the terminal pin on which the protrusion is formed.

6. The controller of claim 5, wherein the bracket further includes a plate disposed below the bracket body to traverse the cavity.

7. The controller of claim 6, wherein the bracket further includes at least two hooks protruding from the bracket body, and the power module is fixed to the bracket by the hooks.

8. The controller of claim 7, wherein the hooks are disposed to be spaced apart from each other at predetermined intervals with respect to a virtual line L passing through a center of the power module.

9. The controller of claim 8, wherein a groove is formed on a lower surface of the first cover such that an end portion of the hooks is disposed therein.

10. The controller of claim 9, wherein the bracket further includes a protruding part protruding downward from the bracket body, and the protruding part is disposed to be adjacent to the first pin.

11. The controller of claim 10, wherein a protruding height of the first pin is greater than a protruding height of the protruding part.

12. The controller of claim 10, wherein the terminal includes:
a body disposed horizontally,
a frame formed to protrude downward from an end portion of one side of the body, and
an end portion bent at an end portion of the other side of the body and disposed inside the boss, and
wherein the frame is in contact with the terminal pin.

13. The controller of claim 12, wherein a hole is formed in the end portion.

14. The controller of claim 1, further comprising:
a heat transfer member disposed between the power module body and the first cover.

15. The controller of claim 2, wherein a width of the protrusion is less than the width of the terminal pin.

16. A motor assembly comprising:
a motor controller; and
a motor,
wherein the motor controller includes:
a first housing;
a first cover disposed on an opening of the first housing;
filter units disposed above the first cover;
a power module unit disposed below the first cover; and
a substrate disposed below the power module unit,
wherein the power module unit includes:
a bracket; and
a power module disposed between the bracket and the first cover,
wherein the power module includes:
a power module body;
a plurality of first pins arranged to protrude downward from one side of the power module body;
five terminal pins arranged to protrude downward from the other side of the power module body; and
a protrusion protruding from an end portion of each of three terminal pins among the terminal pins, and
wherein an end portion of the protrusion is coupled to the substrate.

17. The motor assembly of claim 16, wherein a width of the protrusion is less than the width of the terminal pin.

18. The motor assembly of claim 16, wherein one surface of the power module is pressed against the first cover, which is made of a metal material, by the bracket.

19. The motor assembly of claim 16, wherein the motor includes a rotation shaft, a rotor disposed outside the rotation shaft, a stator disposed outside the rotor, a bus bar disposed above the stator, a second housing accommodating the rotor, the stator, and the bus bar, and a second cover disposed on an opening of the second housing,
wherein the bus bar includes a bus-bar body and a bus-bar terminal,
wherein the bracket includes:
a bracket body having a structure of a cavity in which the power module is disposed and three bosses protrude downward; and
a terminal having one side disposed to be exposed inside each of the bosses and the other side disposed on the bracket body to protrude downward, and
wherein one side of the bus-bar terminal is coupled to a hole of the terminal.

20. The motor assembly of claim 16, wherein the terminal is in contact with the terminal pin on which the protrusion is formed.

\* \* \* \* \*